(12) United States Patent
Wang et al.

(10) Patent No.: US 12,046,537 B2
(45) Date of Patent: Jul. 23, 2024

(54) FRONT-END-OF-LINE (FEOL) THROUGH SEMICONDUCTOR-ON-SUBSTRATE VIA (TSV)

(71) Applicant: Taiwan Semiconductor Manufacturing Company, Ltd., Hsin-Chu (TW)

(72) Inventors: Yun-Hsiang Wang, Hsinchu (TW); Chun Lin Tsai, Hsin-Chu (TW); Jiun-Lei Jerry Yu, Zhudong Township (TW); Po-Chih Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 75 days.

(21) Appl. No.: 17/869,860

(22) Filed: Jul. 21, 2022

(65) Prior Publication Data

US 2022/0359346 A1 Nov. 10, 2022

Related U.S. Application Data

(62) Division of application No. 16/936,654, filed on Jul. 23, 2020, now Pat. No. 11,521,915.

(Continued)

(51) Int. Cl.
*H01L 23/48* (2006.01)
*H01L 21/768* (2006.01)
*H01L 23/522* (2006.01)

(52) U.S. Cl.
CPC ...... *H01L 23/481* (2013.01); *H01L 21/76804* (2013.01); *H01L 21/76813* (2013.01); *H01L 21/76877* (2013.01); *H01L 23/5226* (2013.01)

(58) Field of Classification Search
CPC ........ H01L 21/76804; H01L 21/76813; H01L 21/76877; H01L 23/5226
See application file for complete search history.

(56) References Cited

U.S. PATENT DOCUMENTS 9,991,373 B1 * 6/2018 Birner ................. H01L 29/4175
2009/0134497 A1 5/2009 Barth et al.
(Continued)

OTHER PUBLICATIONS

Non-Final Office Action dated Nov. 9, 2021 for U.S. Appl. No. 16/936,654.

(Continued)

*Primary Examiner* — Jaehwan Oh
*Assistant Examiner* — John M Parker
(74) *Attorney, Agent, or Firm* — Eschweiler & Potashnik, LLC

(57) ABSTRACT

Various embodiments of the present application are directed towards an integrated circuit (IC) chip comprising a front-end-of-line (FEOL) through semiconductor-on-substrate via (TSV), as well as a method for forming the IC chip. In some embodiments, a semiconductor layer overlies a substrate. The semiconductor layer may, for example, be or comprise a group III-V semiconductor and/or some other suitable semiconductor(s). A semiconductor device is on the semiconductor layer, and a FEOL layer overlies the semiconductor device. The FEOL TSV extends through the FEOL layer and the semiconductor layer to the substrate at a periphery of the IC chip. An intermetal dielectric (IMD) layer overlies the FEOL TSV and the FEOL layer, and an alternating stack of wires and vias is in the IMD layer.

20 Claims, 18 Drawing Sheets

Related U.S. Application Data

(60) Provisional application No. 62/981,684, filed on Feb. 26, 2020.

(56) References Cited

U.S. PATENT DOCUMENTS

| | | |
|---|---|---|
| 2010/0200960 A1 | 8/2010 | Angyal et al. |
| 2012/0142185 A1 | 6/2012 | Park et al. |
| 2012/0153300 A1 | 6/2012 | Lidow et al. |
| 2013/0221494 A1 | 8/2013 | Ramachandran et al. |
| 2015/0021785 A1 | 1/2015 | Lin |
| 2015/0102497 A1 | 4/2015 | Park et al. |
| 2018/0212047 A1 | 7/2018 | Chang et al. |
| 2019/0019770 A1 | 1/2019 | Chang et al. |
| 2019/0081137 A1 | 3/2019 | Yao et al. |
| 2019/0393130 A1 | 12/2019 | Mahnkopf et al. |
| 2020/0203215 A1 | 6/2020 | Jang et al. |
| 2021/0091302 A1 | 3/2021 | Reznicek et al. |

OTHER PUBLICATIONS

Final Office Action dated May 11, 2022 for U.S. Appl. No. 16/936,654.
Notice of Allowance dated Jul. 25, 2022 for U.S. Appl. No. 16/936,654.

\* cited by examiner

FRONT-END-OF-LINE (FEOL) THROUGH SEMICONDUCTOR-ON-SUBSTRATE VIA (TSV)

REFERENCE TO RELATED APPLICATIONS

This Application is a Divisional of U.S. application Ser. No. 16/936,654, filed on Jul. 23, 2020, which claims the benefit of U.S. Provisional Application No. 62/981,684, filed on Feb. 26, 2020. The contents of the above-referenced Patent Applications are hereby incorporated by reference in their entirety.

BACKGROUND

Semiconductor devices based on silicon have been the standard for the past few decades. However, semiconductor devices based on alternative materials are receiving increasing attention for advantages over silicon-based semiconductor devices. For example, semiconductor devices based on gallium nitride (e.g., GaN) and other group III-V semiconductor materials have been receiving increased attention due to high electron mobility and wide band gaps compared to silicon-based semiconductor devices. Such high electron mobility and wide band gaps allow improved performance and high temperature applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
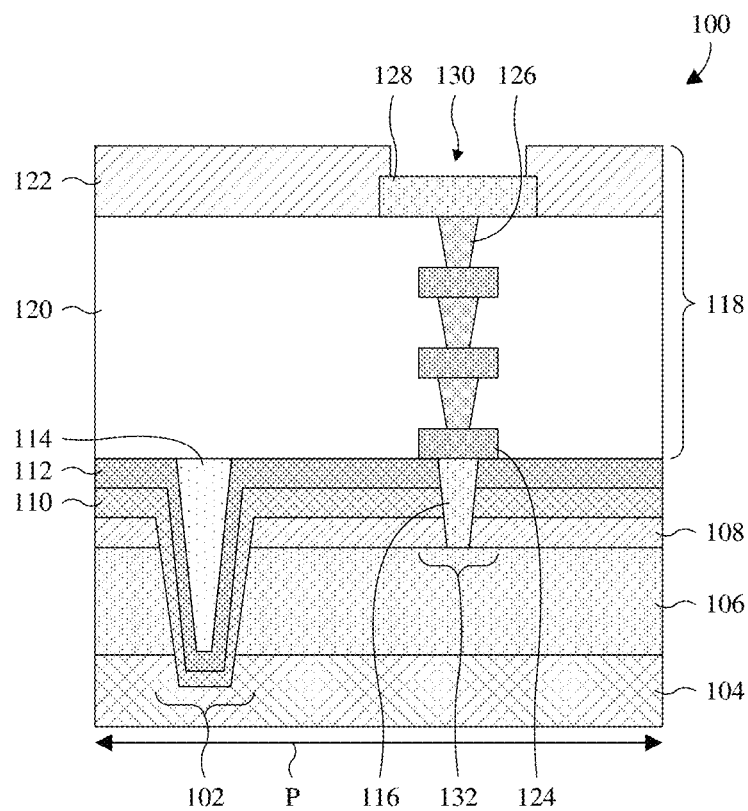
FIG. 1 illustrates a cross-sectional view of some embodiments of an integrated circuit (IC) chip comprising a front-end-of-line (FEOL) through semiconductor-on-substrate via (TSV).

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated circuit (IC) chips comprise a substrate and a group III-V layer overlying the substrate. A front-end-of-line (FEOL) layer and a semiconductor device overlie the group III-V layer with the semiconductor device buried in the FEOL layer. Multiple interlayer dielectric (ILD) layers are stacked overlying the FEOL layer, and a back-end-of-line (BEOL) interconnect structure overlies the ILD layers. The BEOL interconnect structure comprises an intermetal dielectric (IMD) layer, as well as a plurality of wires and a plurality of vias stacked in the IMD layer. A back-end-of-line (BEOL) through group III-V via (TGV) is at a periphery of the IC chip and extends through the BEOL interconnect structure, the ILD layers, the FEOL layer, and the group III-V layer to the substrate. The BEOL TGV may, for example, be employed as a seal ring or for electrical coupling to the substrate.

A method for forming the BEOL TGV includes etching through the IMD layer, the ILD layers, the FEOL layer, and the group III-V layer to form a trench within which the BEOL TGV is formed. A challenge with the method is that the IMD and ILD layers are thick and hence the etch depth is large. For example, a thickness of the IMD and ILD layers may be about 12-13 micrometers or some other suitable value. Because the etch depth is large, the etching takes a large amount of time and bulk manufacturing throughput is low. For example, etching through the IMD and ILD layers may take about 40 minutes or some other suitable value. Further, because the etch depth is large, the etching may be broken into multiple etches using different photoresist masks formed by photolithography. Because photolithography is expensive, using multiple photoresist masks may lead to high costs. Further yet, because the etch depth is large, the trench may have a high aspect ratio (e.g., a high ratio of height to width). As such, material deposited in the trench to form the BEOL TGV may have a high likelihood of deposition with voids. At least when the BEOL TGV is employed for electrical coupling to the substrate, voids increase a resistance of the BEOL TGV and hence degrade performance of the BEOL TGV. Therefore, the high likelihood of deposition with voids may increase the likelihood of the BEOL TGV falling outside of design specifications and may hence decrease yields.

Various embodiments of the present disclosure are directed towards a method for forming an IC chip comprising a FEOL through semiconductor-on-substrate via (TSV), as well as the IC chip resulting from the method. In some embodiments of the method, a semiconductor layer is deposited over a substrate. The semiconductor layer may, for example, be or comprise a group III-V semiconductor and/or some other suitable semiconductor(s). A FEOL layer and a semiconductor device are formed overlying the semiconductor layer with the semiconductor device buried in the FEOL layer. A photolithography/etching process is performed to form a trench at a periphery of the IC chip and extending through the FEOL layer and the semiconductor layer to the substrate. The FEOL TSV is formed filling the trench and a plurality of ILD layers is formed overlying the FEOL layer. In some embodiments, the ILD layers partially define the FEOL TSV. In alternative embodiments, the ILD layers overlie and are independent of the FEOL TSV. A BEOL interconnect structure is formed overlying the ILD layers and comprises a plurality of wires, a plurality of vias, and an IMD layer accommodating the wires and the vias.

Because the trench is formed before the ILD layers and the IMD layer are deposited, the etching to form the trench does not extend through the ILD and IMD layers. As a result, the etch depth is small. Because the etch depth is small, the etching takes a small amount of time and bulk manufacturing throughput is high. Further, because the etch depth is small, the etching may be performed with a single photoresist mask formed by photolithography. Because photolithography is expensive, using a single photoresist mask may lead to low costs. Further yet, because the etch depth is small, the trench may have a small aspect ratio. As such, material deposited in the trench to form the FEOL TSV may have a low likelihood of deposition with voids. At least when the FEOL TSV is employed for electrical coupling to the substrate, voids increase a resistance of the FEOL TSV and hence degrade performance of the FEOL TSV. Therefore, the low likelihood of deposition with voids may decrease the likelihood of the FEOL TSV falling outside design specifications and may hence increase yields.

With reference to FIG. 1, a cross-sectional view 100 of some embodiments of an IC chip comprising a FEOL TSV 102 is provided. The FEOL TSV 102 overlies a substrate 104 at a peripheral region P of the IC chip and extends through a semiconductor layer 106 and a FEOL layer 108 to the substrate 104. The semiconductor layer 106 overlies the substrate 104, and the FEOL layer 108 overlies the semiconductor layer 106. Further, the FEOL TSV 102 is defined by a first ILD layer 110, a second ILD layer 112, and a gap fill layer 114. In alternative embodiments, the first ILD layer 110 and/or the second ILD layer 112 is/are omitted. The first ILD layer 110 overlies the FEOL layer 108, the second ILD layer 112 overlies the first ILD layer 110, and the gap fill layer 114 overlies the second ILD layer 112.

A contact 116 is in the first and second ILD layers 110, 112 and the FEOL layer 108 at a location laterally offset from the FEOL TSV 102. In alternative embodiments, the contact 116 is omitted. Further, a BEOL interconnect structure 118 covers the FEOL TSV 102, the second ILD layer 112, and the contact 116. The BEOL interconnect structure 118 comprises an IMD layer 120 and a passivation layer 122 overlying the IMD layer 120. Further, the BEOL interconnect structure 118 comprises a plurality of wires 124, a plurality of vias 126, and a pad 128. The wires 124 and the vias 126 are alternatingly stacked in the IMD layer 120 and overlie the contact 116. The pad 128 overlies the wires 124 and the vias 126 between the IMD layer 120 and the passivation layer 122. Further, the pad 128 is exposed by a pad opening 130 defined by the passivation layer 122. In alternative embodiments, the pad opening 130 is omitted. Collectively, the contact 116, the wires 124, the vias 126, and the pad 128 define a conductive seal structure 132.

Because the FEOL TSV 102 underlies the IMD layer 120 and is defined by the first and second ILD layers 110, 112, a trench accommodating the FEOL TSV 102 is formed before the first and second ILD layers 110, 112 and the IMD layer 120. As such, etching to form the trench does not extend through the first and second ILD layers 110, 112 and the IMD layer 120. The first and second ILD layers 110, 112 and the IMD layer 120 have a large thickness, such that the etching would have a large etch depth if the etching extended through the first and second ILD layers 110, 112 and the IMD layer 120. However, because the etching does not extend through first and second ILD layers 110, 112 and the IMD layer 120, the etching has a small etch depth. Because the etching has the small etch depth, the etching takes a small amount of time and bulk manufacturing throughput is high. For example, the etching may be about 50% faster or some other suitable percentage faster when not etching through the first and second ILD layers 110, 112 and the IMD layer 120. Further, because the etching has the small etch depth, the etching may be performed with a single photoresist mask formed by photolithography. Because photolithography is expensive, using a single photoresist mask may lead to low costs.

The conductive seal structure 132 and the FEOL TSV 102 coordinate to seal the peripheral region P of the IC chip so as to protect an interior region of the IC chip (not shown). For example, the conductive seal structure 132 and the FEOL TSV 102 may prevent moisture and/or vapor from entering the IC chip at the peripheral region P of the IC chip. Moisture and/or vapor that enter the IC chip may cause corrosion to conductive features and/or semiconductor devices in the IC chip. As another example, the conductive seal structure 132 and the FEOL TSV 102 may prevents cracks caused by a die saw from propagating though the IC chip during separation of the IC chip from a wafer. Cracks that propagate through the IC chip may cause delamination of layers and/or structures in the IC chip.

As described above, the etching to form the trench accommodating the FEOL TSV 102 may has a small etch depth. Because the etching has the small etch depth, the trench may have a small aspect ratio (e.g., a small ratio of height to width). As such, the first and second ILD layers 110, 112 and the gap fill layer 114 may have a low likelihood of deposition with voids. Voids may hinder the FEOL TSV 102 from protecting the interior region of the IC chip. For example, voids may hinder the FEOL TSV 102 from blocking moisture and/or vapor from entering the IC chip and/or may hinder the FEOL TSV 102 from stopping the propagation of cracks caused by a die saw. Therefore, the low likelihood of deposition with voids may decrease the likelihood of the FEOL TSV falling outside design specifications and may hence increase yields.

Referring back to the FEOL layer 108, the FEOL layer 108 is between the semiconductor layer 106 and the first ILD layer 110 and is made up of multiple layers (not individually shown) deposited during FEOL processing. Further, the FEOL layer 108 covers semiconductor devices (not shown) on the semiconductor layer 106 and, in some embodiments, at least partially defines the semiconductor devices. The layers making up the FEOL layer 108 may, for example, include an ILD layer, a pad oxide layer, a pad nitride layer, a contact etch stop layer (CESL), a gate dielectric layer, some other suitable layer(s), or any combination of the foregoing. In some embodiments, the FEOL layer 108 is limited to dielectric oxides and/or other suitable dielectrics. Further, in some embodiments, a thickness of the FEOL layer 108 is about 3.5-4.0 kilo angstroms (kA), about 4.0-4.5 kA, about 3.5-4.5 kA, or some other suitable value.

In some embodiments, the semiconductor layer 106 is or comprises a group III-V material. For example, the semiconductor layer 106 may be or comprise gallium nitride (e.g., GaN), gallium arsenide (e.g., GaAs), indium phosphide (InP), some other suitable group III-V material(s), or any combination of the foregoing. In alternative embodiments, the semiconductor layer 106 is or comprises a group II-VI material, a group IV-IV material, or some other suitable semiconductor material. In some embodiments, the semiconductor layer 106 is made up of multiple layers (not individually shown) defining a 2-dimensional electron gas (2DEG) or a 2-dimensional hole gas (2DHG) along a heterojunction. For example, the semiconductor layer 106 may comprise an aluminum gallium nitride layer and a gallium nitride layer that directly contact to define a heterojunction and a 2DEG along the heterojunction. In some embodiments, a thickness of the semiconductor layer 106 is about 45-55 kA, about 55-65 kA, about 45-65 kA, about 58 kA, about 50 kA, or some other suitable value.

In some embodiments, the substrate 104 is or comprises a bulk substrate of monocrystalline silicon, a bulk substrate of silicon carbide, a silicon-on-insulator (SOI) substrate, or some other suitable type of semiconductor substrate.

In some embodiments, each of the first ILD layer 110, the second ILD layer 112, and the IMD layer 120 is a dielectric oxide and/or some other suitable dielectric(s). In some embodiments, the gap fill layer 114 is or comprise a dielectric oxide and/or some other suitable dielectric(s). In alternative embodiments, the gap fill layer 114 is or comprise a conductive material and/or some other suitable material. In some embodiments, the first ILD layer 110 and the second ILD layer 112 are different dielectrics, the second ILD layer 112 and the gap fill layer 114 are different materials, the second ILD layer 112 and the IMD layer 120 are different dielectrics, or any combination of the foregoing. In some embodiments, any one or combination of the first ILD layer 110, the second ILD layer 112, and the gap fill layer 114 has a lower permeability for moisture and/or vapor than the FEOL layer 108 to prevent moisture and/or vapor from entering the FEOL layer 108 from an ambient environment of the IC chip. Such moisture and/or vapor may corrode and hence damage semiconductor devices (not shown) in the FEOL layer 108. In some embodiments, the gap fill layer 114 has a lower permeability for moisture and/or vapor than the first and/or second ILD layer(s) 110, 112, and/or the second ILD layer 112 has a lower permeability for moisture and/or vapor than the first ILD layer 110. In some embodiments, the first ILD layer 110, the second ILD layer 112, and the IMD layer 120 have a combined thickness of about 120-140 kA, about 120-130 kA, about 130-140 kA, about 125 kA, about 126 kA, or some other suitable value.

In some embodiments, the contact 116 is or comprises tungsten and/or some other suitable metal(s). In some embodiments, the wires 124, the vias 126, and the pad 128 are or comprise copper, aluminum copper, aluminum, some other suitable metal(s), or any combination of the foregoing.

Figure 2:
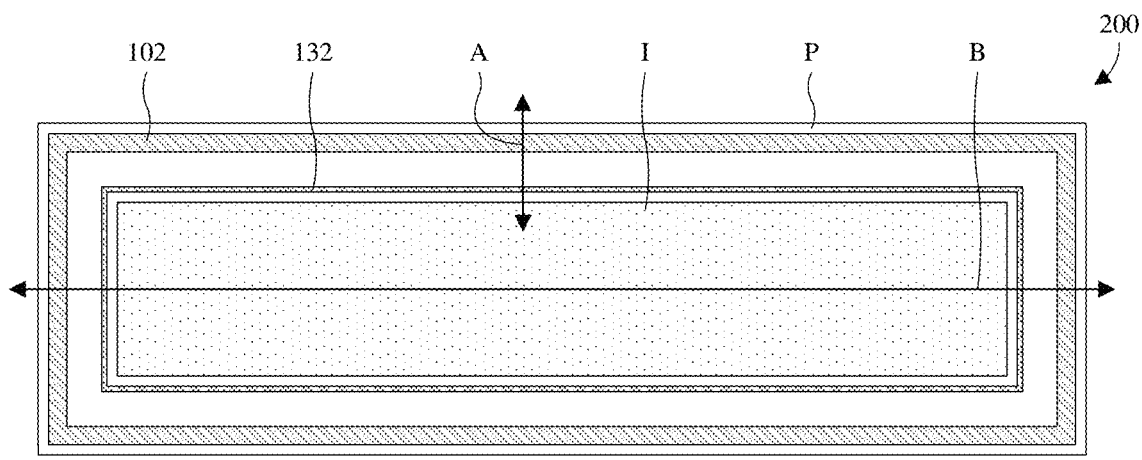
FIG. 2 illustrates a top layout view of some embodiments of the FEOL TSV of FIG. 1.

With reference to FIG. 2, a top layout view 200 of some embodiments of the IC chip of FIG. 1 is provided. The cross-sectional view 100 of FIG. 1 may, for example, be taken along line A, but other suitable locations are amenable. The FEOL TSV 102 and the conductive seal structure 132 extend along the peripheral region P of the IC chip in individual closed paths to surround an interior region I of the IC chip. The closed paths are rectangular ring-shaped, but may be circular ring-shaped, square ring-shaped, or some other suitable shape. Further, the conductive seal structure 132 is between the FEOL TSV 102 and the interior region I of the IC chip. As will be seen hereafter, the interior region I of the IC chip accommodates semiconductor devices (not shown) and conductive interconnects (not shown) defining circuitry.

The FEOL TSV 102 and the conductive seal structure 132 coordinate to seal the peripheral region P of the IC chip so as to protect the interior region I of the IC chip. For example, the FEOL TSV 102 and the conductive seal structure 132 may prevent moisture and/or vapor from entering the IC chip at the peripheral region P of the IC chip so. As another example, the FEOL TSV 102 and the conductive seal structure 132 may prevent cracks caused by a die saw from propagating though the IC chip during separation of the IC chip from a wafer.

With reference to FIGS. 3A-3E, cross-sectional views 300A-300E of some alternative embodiments of the IC chip of FIG. 1 are provided.

Figure 3A:
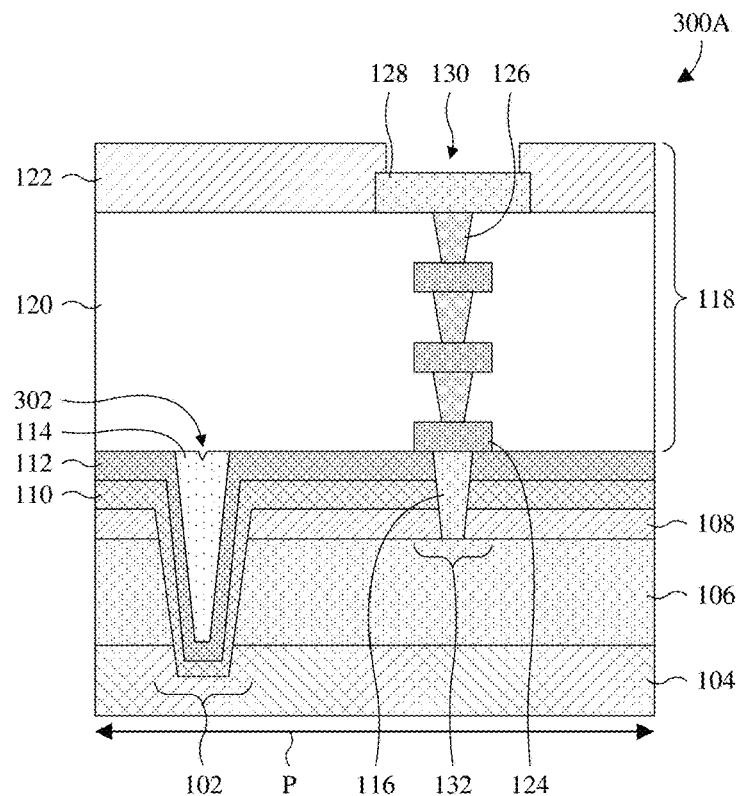
FIGS. 3A-3E illustrate cross-sectional views of some different alternative embodiments of the IC chip of FIG. 1.

In FIG. 3A, a top surface of the gap fill layer 114 has an indent 302. The indent 302 may, for example, result from deposition of the gap fill layer 114 in a trench and a subsequent planarization that does not extend far enough to fully remove the indent 302.

Figure 3B:
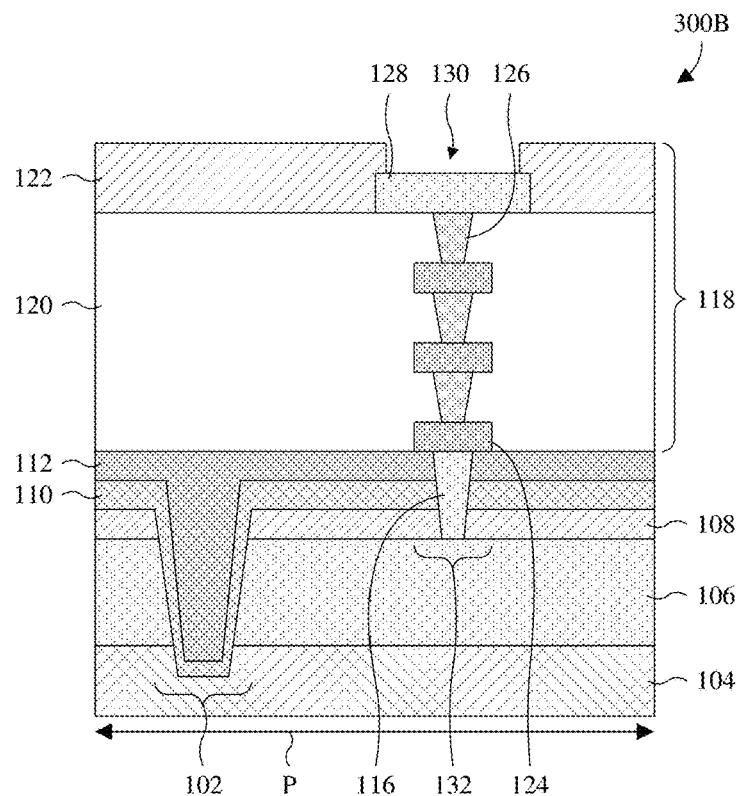

In FIG. 3B, the gap fill layer 114 is omitted and the second ILD layer 112 occupies the space previously occupied by the gap fill layer 114. This may, for example, be achieved by depositing the second ILD layer 112 in a trench with a thickness large enough to fully fill the trench and then planarizing the second ILD layer 112 to thin the second ILD layer 112.

Figure 3C:
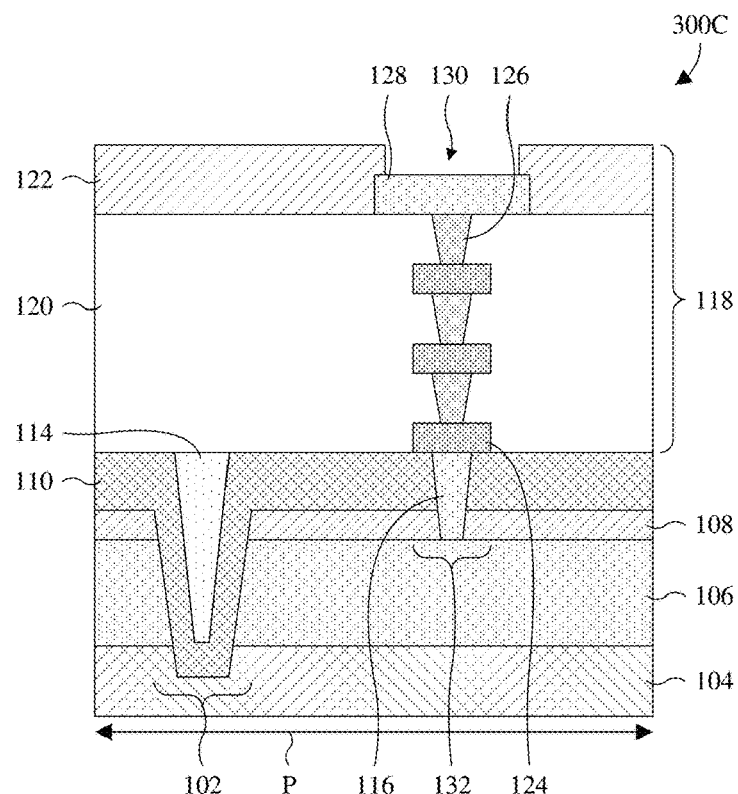

In FIG. 3C, the second ILD layer 112 is omitted and the space occupied by the second ILD layer 112 is occupied by the first ILD layer 110.

Figure 3D:
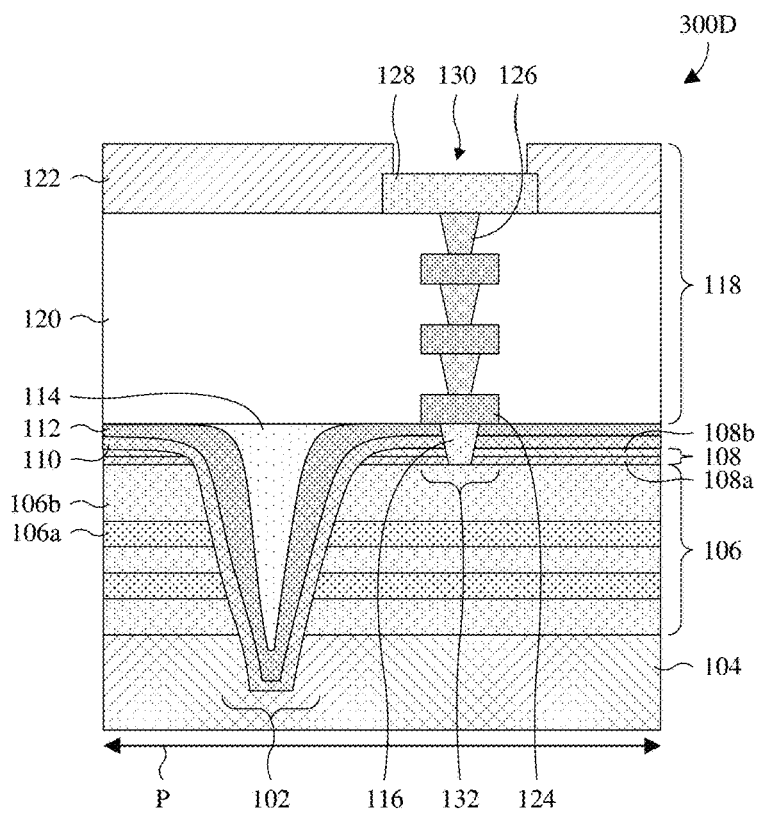

In FIG. 3D, the first and second ILD layers 110, 112 and the gap fill layer 114 have dimensions with less uniformity and further have edges and sidewalls that are curved. Further, the semiconductor layer 106 includes multiple layers (e.g., 106a and 106b) and the FEOL layer 108 includes multiple layers (e.g., 108a and 108b). For example, a first layer 106a of the semiconductor layer 106 may be or comprise gallium nitride, whereas a second layer 106b of the semiconductor layer 106 may be or comprise aluminum gallium nitride, or vice versa. Other suitable materials beyond those in the example are, however, amenable.

Figure 3E:
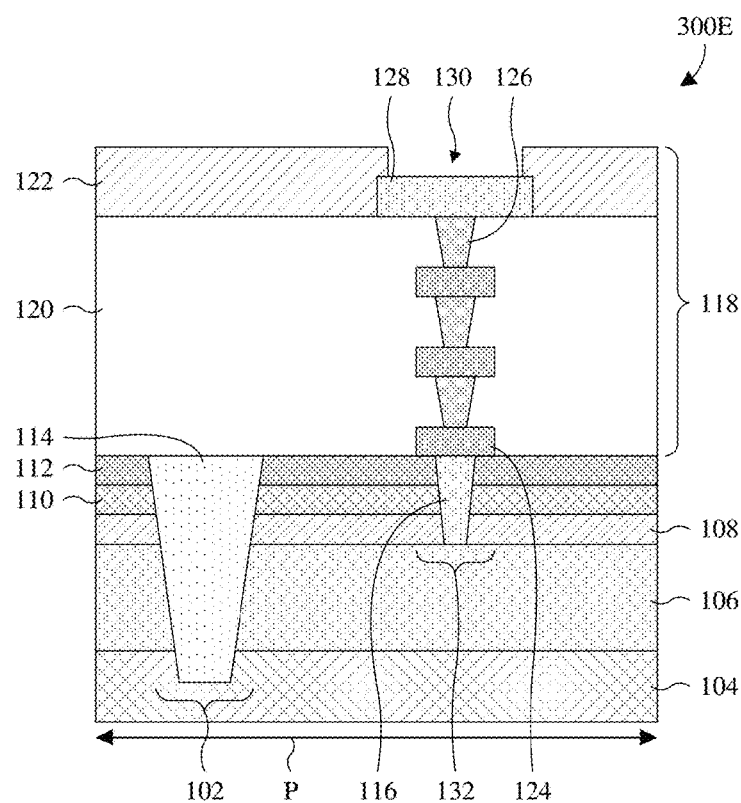

In FIG. 3E, the gap fill layer 114 fully defines the FEOL TSV 102 and extends through both the first and second ILD layers 110, 112 to the substrate 104. Because the FEOL TSV 102 underlies the IMD layer 120, a trench accommodating the FEOL TSV 102 is formed before the IMD layer 120. As such, etching to form the trench does not extend through the IMD layer 120. The IMD layer 120 has a large thickness, such that the etching would have a large etch depth if the etching extended through the IMD layer 120. However, because the etching does not extend through the IMD layer 120, the etching has a small etch depth. Note that the small etch depth is not as small as in FIG. 1 because the etching extends through the first and second ILD layers 110, 112. Because the etching has the small etch depth, the etching takes a small amount of time and bulk manufacturing throughput is high. Further, the etching may be performed with a single photoresist mask formed by photolithography, which leads to low costs.

Figure 4:
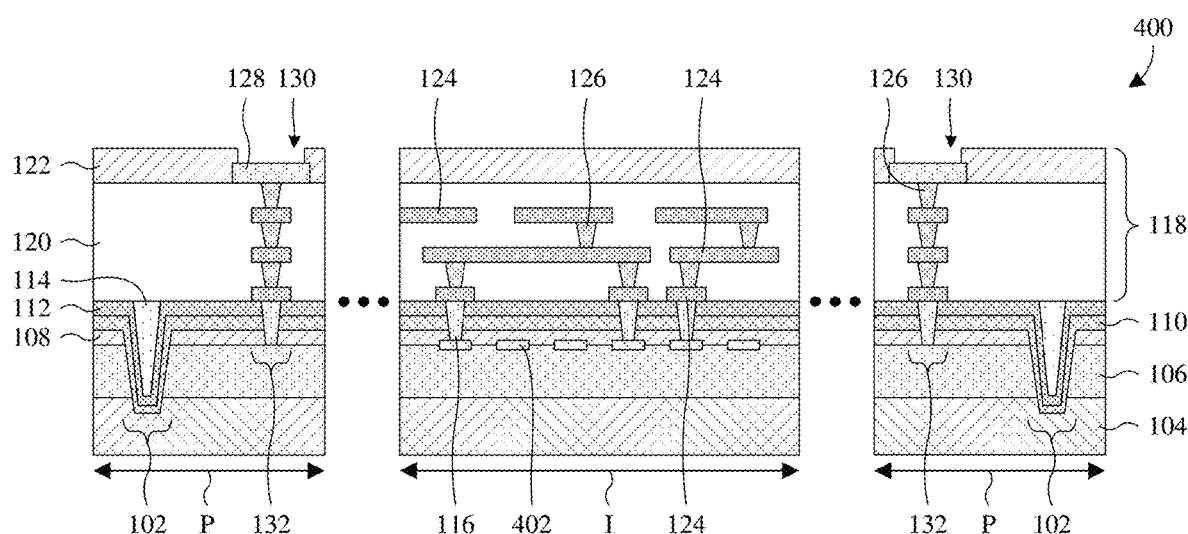
FIG. 4 illustrates an expanded cross-sectional view of some embodiments of the IC chip of FIG. 1 in which the FEOL TSV surrounds an interior region of the IC chip.

With reference to FIG. 4, an expanded cross-sectional view 400 of some embodiments of the IC chip of FIG. 1 is provided in which the FEOL TSV 102 and the conductive seal structure 132 surround the interior region I of the IC chip at the peripheral region P of the IC chip. The FEOL TSV 102 has a pair of segments respectively on opposite sides of the interior region I of the IC chip. Similarly, the conductive seal structure 132 has a pair of segments respectively on the opposite sides of the interior region I of the IC chip. Further, the segments of the conductive seal structure 132 are between the segments of the FEOL TSV 102.

In some embodiments, the FEOL TSV 102 and the conductive seal structure 132 extend in individual closed paths to surround the interior region I of the IC chip when viewed top down. Further, in some embodiments, the IC chip has a top layout as in FIG. 2. For example, the expanded cross-sectional view 400 may be take along line B in FIG. 2. In alternative embodiments, the IC chip has some other suitable top layout.

The interior region I of the IC chip accommodates a plurality of semiconductor devices 402 that are interconnected by contacts 116 and the BEOL interconnect structure 118 to define a circuit. Note that while not shown, there may be additional pads (see, e.g., pads 128) electrically coupling the circuit to external devices and/or circuits.

The semiconductor devices 402 are between the semiconductor layer 106 and the FEOL layer 108 and may, for example, be high electron mobility transistors (HEMTs), metal-oxide-semiconductor (MOS) HEMTs, metal-insulator-semiconductor field-effect transistors (MISFETs), some other suitable type of semiconductor device, or any combination of the foregoing. The semiconductor devices 402 are partially defined by the semiconductor layer 106 and, in some embodiments, are partially defined by the FEOL layer 108. For example, the semiconductor layer 106 may define a 2DEG of the semiconductor devices 402 and/or the FEOL layer 108 may define a gate dielectric layer of the semiconductor devices 402. As above, the semiconductor layer 106 may be made up of multiple layers and/or may be or comprise a group III-V material, a group II-VI material, a group IV-IV material, some other suitable semiconductor material, or any combination of the foregoing.

While the IC chip of FIG. 4 is illustrated with embodiments of the FEOL TSV 102 in FIG. 1, the IC chip of FIG. 4 may alternatively use embodiments of the FEOL TSV 102 in any of FIGS. 3A-3E. Similarly, while the IC chip of FIG. 4 is illustrated with embodiments of the semiconductor layer 106 and embodiments of the FEOL layer 108 in FIG. 1, the IC chip of FIG. 4 may alternatively use embodiments of the semiconductor layer 106 in FIG. 3D and/or may alternatively use embodiments of the FEOL layer 108 in FIG. 3D.

Figure 5:
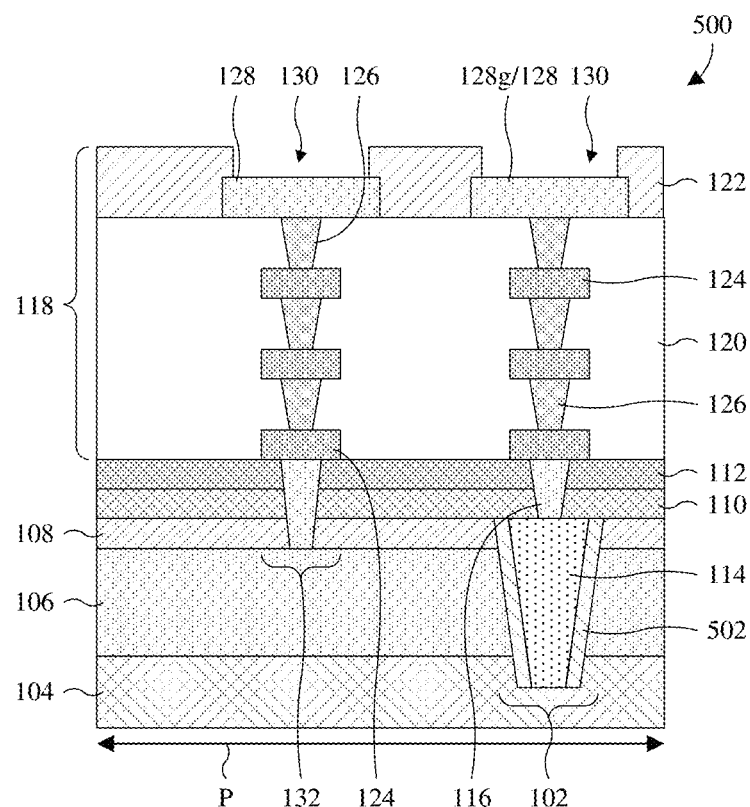
FIG. 5 illustrates a cross-sectional view of some alternative embodiments of the IC chip of FIG. 1 in which the FEOL TSV provides electrical coupling to a substrate.

With reference to FIG. 5, a cross-sectional view 500 of some alternative embodiments of the IC chip of FIG. 1 is provided in which the FEOL TSV 102 provides electrical coupling to the substrate 104. The electrical coupling may, for example, be employed to ground the substrate 104 or to otherwise bias the substrate 104. The FEOL TSV 102 is defined by the gap fill layer 114 and a sidewall spacer structure 502. The gap fill layer 114 is conductive and extends through the FEOL layer 108 and the semiconductor layer 106 to the substrate 104. The gap fill layer 114 may, for example, be or comprise metal and/or some other suitable conductive material(s). The sidewall spacer structure 502 is dielectric and separates the gap fill layer 114 from the FEOL layer 108 and the semiconductor layer 106. The sidewall spacer structure 502 may, for example, be or comprise silicon oxide, silicon nitride, silicon oxynitride, some other suitable dielectric(s), or any combination of the foregoing.

The first and second ILD layers 110, 112 are over the FEOL TSV 102 and, in contrast with FIG. 1, are independent of the FEOL TSV 102. Contacts 116 are in the first and second ILD layers 110, 112, and the BEOL interconnect structure 118 is over the second ILD layer 112 and the contacts 116. At least one of the contacts 116 and the BEOL interconnect structure 118 define a conductive path extending from the FEOL TSV 102. The conductive path may, for example, electrically couple the FEOL TSV 102 to a ground pad 128g or some other suitable pad. Alternatively, the conductive path may, for example, electrically couple the FEOL TSV 102 to a circuit (not shown) at an interior region of the IC chip. Further, as in FIG. 1, at least one of the contacts 116 and the BEOL interconnect structure 118 define the conductive seal structure 132.

Figure 6:
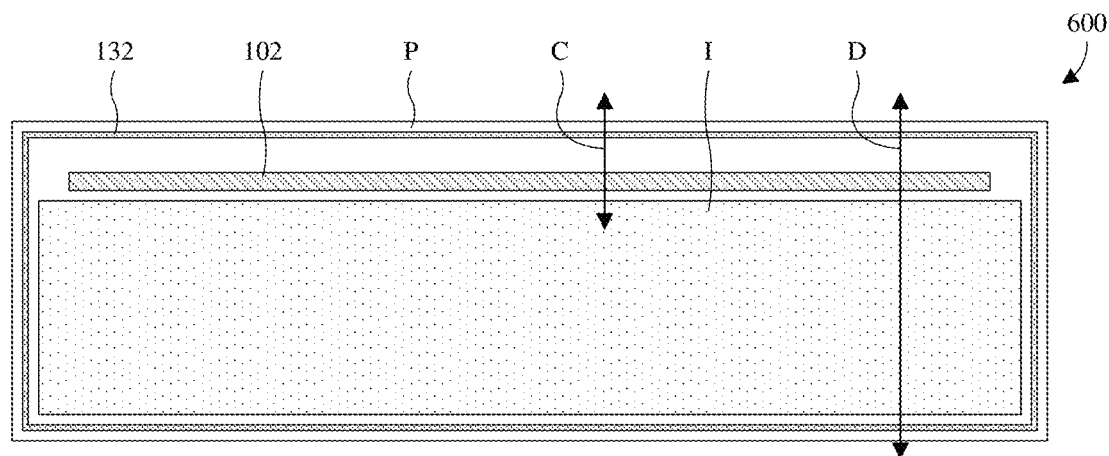
FIG. 6 illustrates a top layout view of some embodiments of the FEOL TSV of FIG. 5.

With reference to FIG. 6, a top layout view 600 of some embodiments of the IC chip of FIG. 5 is provided. The cross-sectional view 500 of FIG. 5 may, for example, be taken along line C, but other suitable locations are amenable. The conductive seal structure 132 and the FEOL TSV 102 are at the peripheral region P of the IC chip. The conductive seal structure 132 extends in a closed path to surround the FEOL TSV 102 and the interior region I of the IC chip. The closed path is rectangular ring-shaped, but may be circular ring-shaped, square ring-shaped, or some other suitable shape. Further, the conductive seal structure 132 seals the periphery of the IC chip so as to protect the interior region I of the IC chip. The FEOL TSV 102 is line shaped and is localized to a single side of the IC chip. In alternative embodiments, the FEOL TSV 102 is on multiple sides of the IC chip and/or has other suitable shapes. Further, the FEOL TSV 102 is between the conductive seal structure 132 and the interior region I of the IC chip.

Figure 7A:
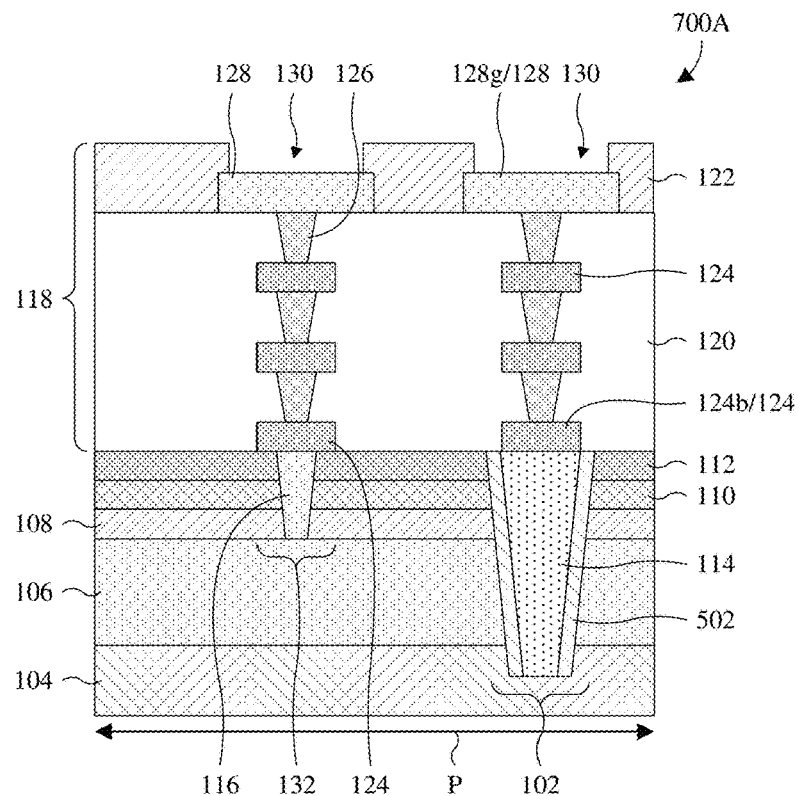
FIGS. 7A-7C illustrate cross-sectional views of some different alternative embodiments of the IC chip of FIG. 5.
Figure 7B:
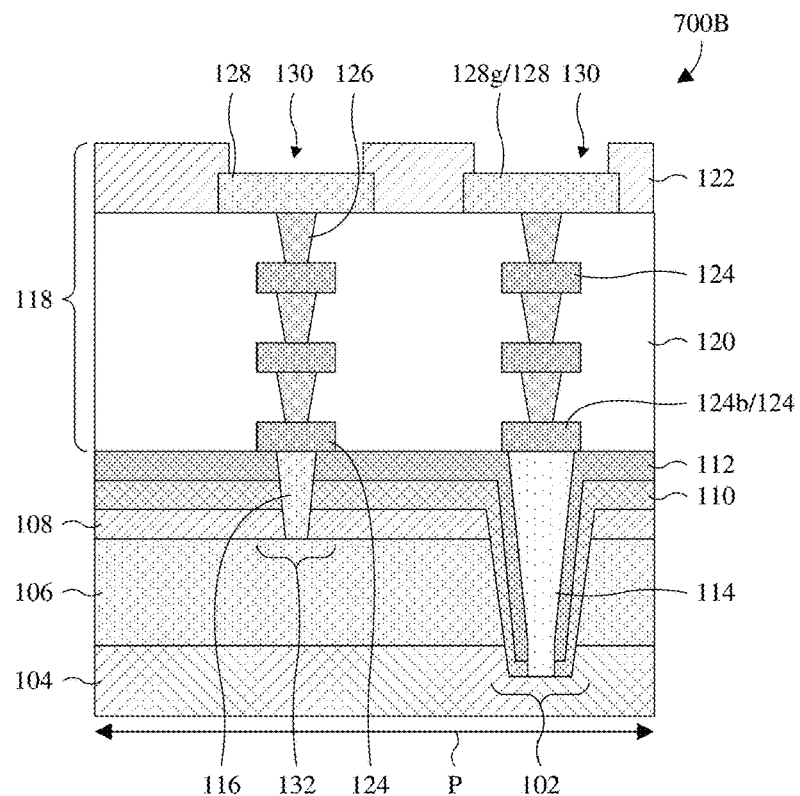
Figure 7C:
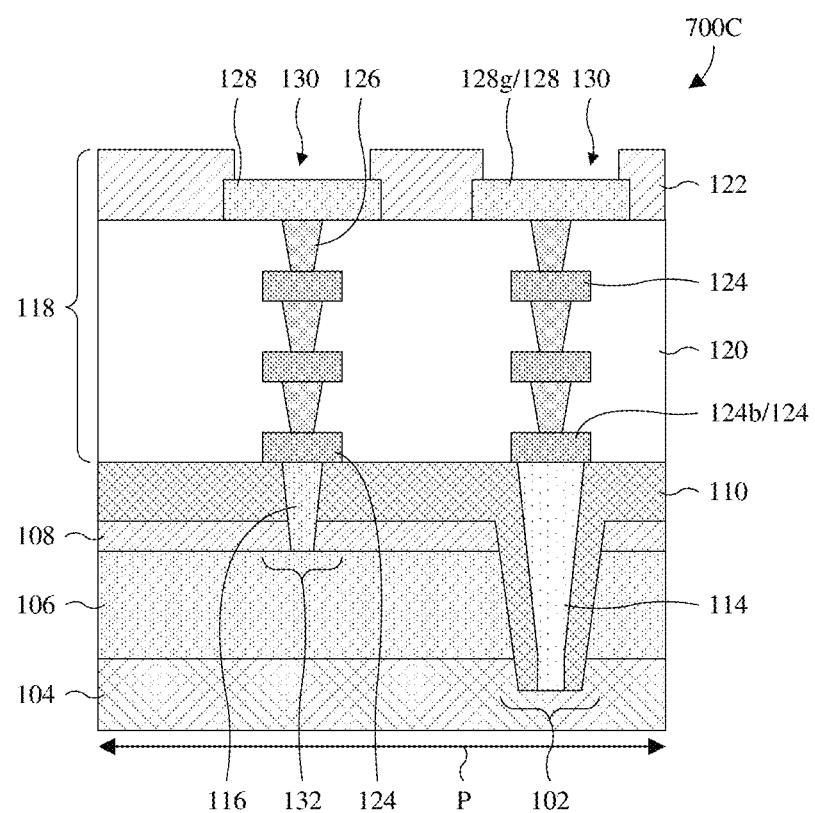

With reference to FIGS. 7A-7C, a cross-sectional view 700A-700C of some different alternative embodiments of the IC chip of FIG. 5 is provided.

In FIG. 7A, the FEOL TSV 102 extends through both the first and second ILD layers 110, 112, from the BEOL interconnect structure 118 to the substrate 104. Further, the FEOL TSV 102 electrically couples to the BEOL interconnect structure 118 at a bottom wire 124b.

In FIG. 7B, the first and second ILD layers 110, 112 separate the gap fill layer 114 from the FEOL layer 108 and the semiconductor layer 106. Further, the sidewall spacer structure 502 is omitted and the FEOL TSV 102 electrically couples to the BEOL interconnect structure 118 at the bottom wire 124b.

In FIG. 7C, the second ILD layer 112 is omitted and the space occupied by the second ILD layer 112 is occupied by the first ILD layer 110.

Figure 8:
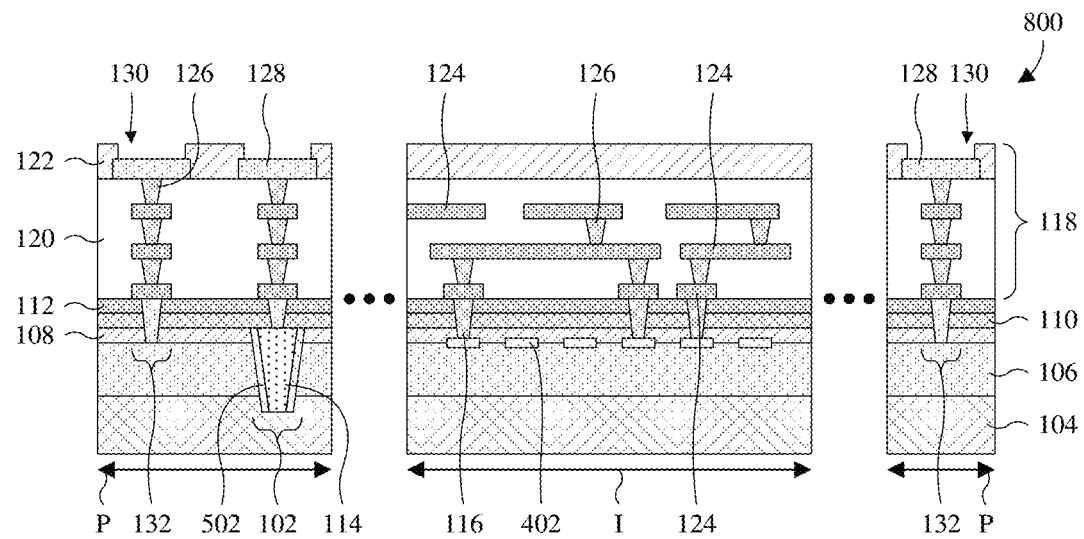
FIG. 8 illustrates an expanded cross-sectional view of some embodiments of the IC chip of FIG. 5 in which the FEOL TSV is on a single side of an interior region of the IC chip.

With reference to FIG. 8, an expanded cross-sectional view 800 of some embodiments of the IC chip of FIG. 5 is provided in which the conductive seal structure 132 surrounds the FEOL TSV 102 and the interior region I of the IC chip. Further, the FEOL TSV 102 is localized to a single side of the IC chip and is between the conductive seal structure 132 and the interior region I. In some embodiments, the FEOL TSV 102 is line shaped when viewed top down and/or the conductive seal structure 132 extends in a closed path to surround the interior region I of the IC chip when viewed top down. Further, in some embodiments, the IC chip has a top layout as in FIG. 6. For example, the expanded cross-sectional view 800 may be taken along line D in FIG. 6. In alternative embodiments, the IC chip has some other suitable top layout.

The interior region I accommodates a plurality of semiconductor devices 402 that are interconnected by contacts 116 and the BEOL interconnect structure 118 to define a circuit. Note that while not shown, there may be additional pads (see, e.g., pads 128) electrically coupling the circuit to external devices and/or circuits. The interior region I and the semiconductor devices 402 may, for example be as described with regard to FIG. 4.

While the IC chip of FIG. 8 is illustrated with embodiments of the FEOL TSV 102 in FIG. 5, the IC chip of FIG. 8 may alternatively use embodiments of the FEOL TSV 102 in any of FIGS. 7A-7C. Similarly, while the IC chip of FIG. 8 is illustrated with embodiments of the semiconductor layer 106 and embodiments of the FEOL layer 108 in FIG. 5, the IC chip of FIG. 8 may alternatively use embodiments of the semiconductor layer 106 in FIG. 3D and/or may alternatively use embodiments of the FEOL layer 108 in FIG. 3D.

With reference to FIGS. 9-15, a series of cross-sectional views 900-1500 of some embodiments of a method for forming an IC chip comprising a FEOL TSV is provided. The method may, for example, be employed to form the IC chip in any one or combination of FIGS. 1, 2, and 4 or to form some other suitable IC chip.

Figure 9:
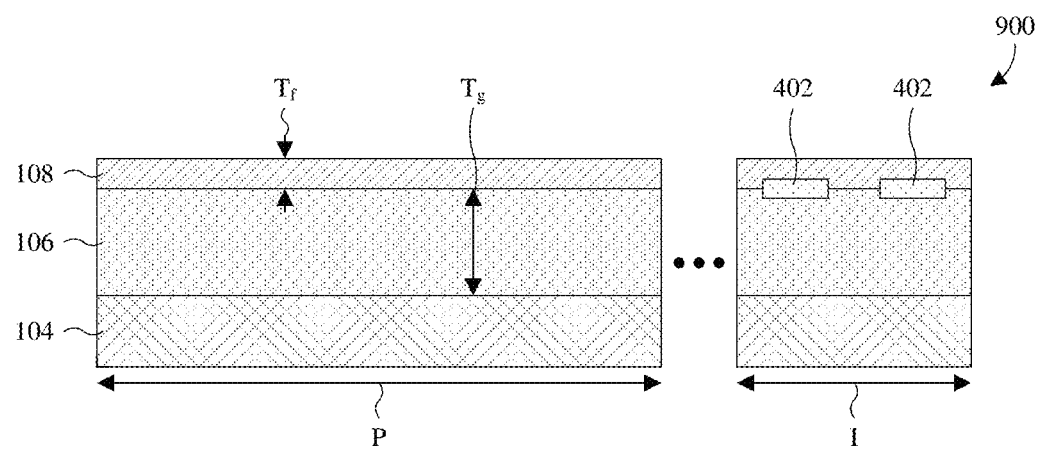
FIGS. 9-15 illustrate a series of cross-sectional views of some embodiments of a method for forming an IC chip comprising a FEOL TSV.

As illustrated by the cross-sectional view 900 of FIG. 9, a semiconductor layer 106 is deposited over a substrate 104 at a peripheral region P of the IC chip being formed and an interior region I of the IC chip being formed. In some embodiments, the semiconductor layer 106 is made up of multiple layers (not individually shown) defining a heterojunction. In some embodiments, the multiple layers further define a 2DEG or a DHG along the heterojunction. In some embodiments, the semiconductor layer 106 is or comprises a group III-V material. For example, the semiconductor layer 106 may, for example, be or comprise gallium nitride (e.g., GaN), gallium arsenide (e.g., GaAs), indium phosphide (InP), some other suitable group III-V material(s), or any combination of the foregoing. In alternative embodiments, the semiconductor layer 106 is or comprises a group II-VI material, a group IV-IV material, or some other suitable semiconductor material. In some embodiments, a thickness $T_g$ of the semiconductor layer 106 is about 45-55 kÅ, about 55-65 kÅ, about 45-65 kÅ, about 58 kÅ, about 50 kÅ, or some other suitable value.

Also illustrated by the cross-sectional view 900 of FIG. 9, FEOL processing is performed to form a plurality of semiconductor devices 402 and a FEOL layer 108. The plurality of semiconductor devices 402 is formed on the semiconductor layer 106 at the interior region I, but not at the peripheral region P. On the other hand, the FEOL layer 108 is formed at both the peripheral region P and the interior region I. In some embodiments, the peripheral region P and the interior region I have top layouts as in FIG. 2, but other suitable top layouts are amenable. In some embodiments, a thickness $T_f$ of the FEOL layer 108 is about 3.5-4.0 kilo angstroms (kÅ), about 4.0-4.5 kÅ, about 3.5-4.5 kÅ, or some other suitable value.

The FEOL layer 108 is made up of multiple layers (not individually shown) deposited during the FEOL processing. Further, the FEOL layer 108 covers the semiconductor devices 402 on the semiconductor layer 106 and, in some embodiments, at least partially defines the semiconductor devices 402. The layers making up the FEOL layer 108 may, for example, include an ILD layer, a pad oxide layer, a pad nitride layer, a CESL, a gate dielectric layer, some other suitable layer(s), or any combination of the foregoing. In some embodiments, the FEOL layer 108 is limited to dielectric oxides and/or other suitable dielectrics.

The semiconductor devices 402 are between the semiconductor layer 106 and the FEOL layer 108 and may, for example, be HEMTs, MOS HEMTs, MISFETs, some other suitable type of semiconductor device, or any combination of the foregoing. Further, the semiconductor devices 402 are partially defined by the semiconductor layer 106 and, in some embodiments, are partially defined by the FEOL layer 108.

Figure 10:
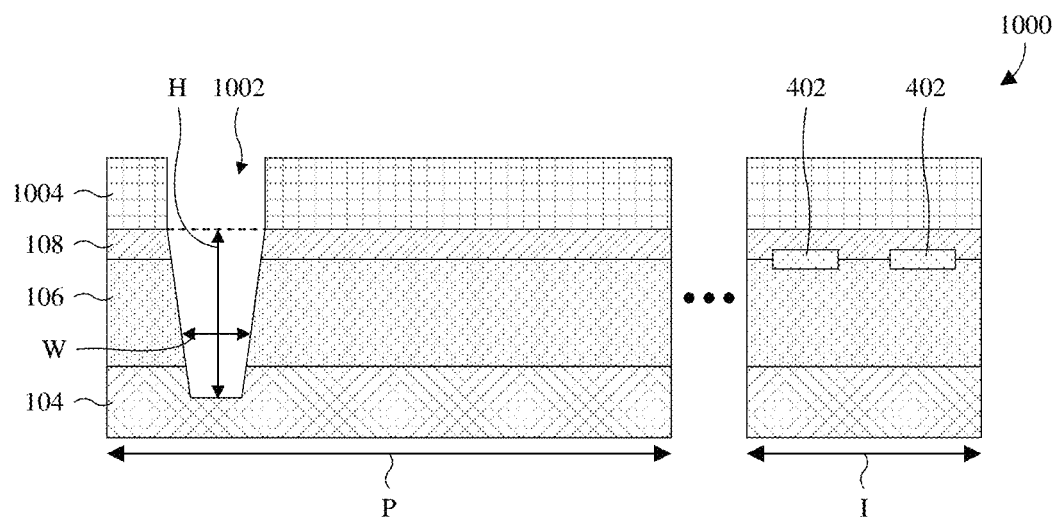

As illustrated by the cross-sectional view 1000 of FIG. 10, the FEOL layer 108 and the semiconductor layer 106 are patterned to form a trench 1002 at the peripheral region P. The trench 1002 extends through the FEOL layer 108 and the semiconductor layer 106 to the substrate 104. In some embodiments, the trench 1002 extends in a closed path to surround the interior region I. For example, the trench 1002 may only be partially shown in the cross-sectional view 1000 of FIG. 10 and may have a square ring-shaped top layout, a circular ring-shaped top layout, or some other suitable top layout extending in a closed path. In some embodiments, the trench 1002 has the same top layout as the FEOL TSV 102 in FIG. 2, whereas the interior region I has a top layout as in FIG. 2.

The patterning to form the trench 1002 may, for example, comprise: 1) forming a mask 1004 over the FEOL layer 108; 2) etching the FEOL layer 108 and the semiconductor layer 106 with the mask 1004 in place to form the trench 1002; 3) and removing the mask 1004. Other suitable processes for the patterning are, however, amenable. The mask 1004 may, for example, be a photoresist mask formed by photolithography or some other suitable type of mask. The etching may, for example, be performed by dry etching, but other suitable types of etching are amenable. In some embodiments, the etching takes about 25-35 minutes, about 30 minutes, or some other suitable amount of time. As seen hereafter, because the etching is not through ILD and IMD layers subsequently formed over the FEOL layer 108, the etch time may be significantly reduced. For example, the etching may be about 50% faster or some other suitable percentage faster when not etching through the ILD and IMD layers.

Figure 11:
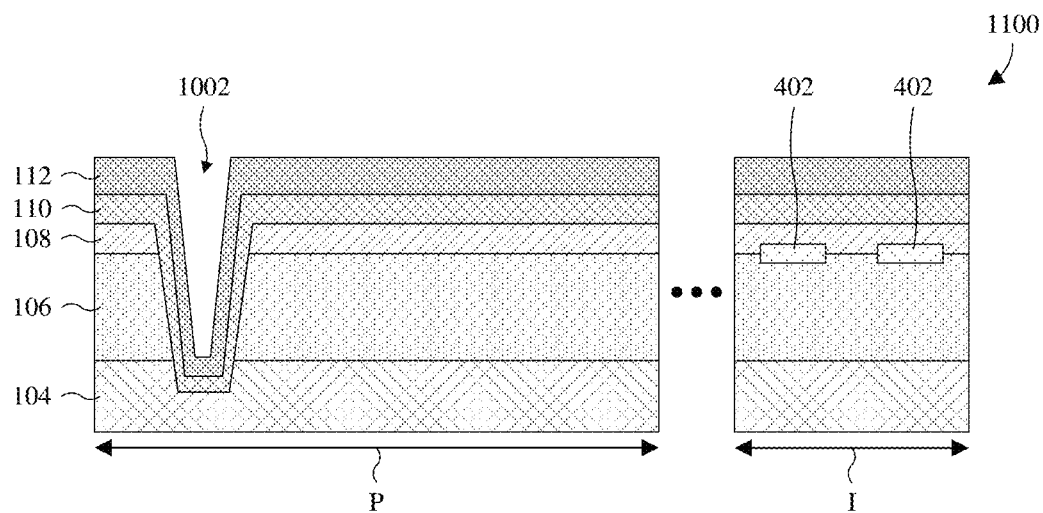

As illustrated by the cross-sectional view 1100 of FIG. 11, a first ILD layer 110 and a second ILD layer 112 are deposited over the FEOL layer 108 and are further deposited lining and partially filling the trench 1002. Further, the second ILD layer 112 is deposited over the first ILD layer 110. In alternative embodiments, the first ILD layer 110 and/or the second ILD layer 112 is/are not deposited. The first ILD layer 110 and the second ILD layer 112 may be deposited in series by corresponding deposition processes. The depositions may, for example, be performed by chemical vapor deposition (CVD), physical vapor deposition (PVD), some other suitable deposition process(es), or any combination of the foregoing.

In some embodiments, the first ILD layer 110 is a dielectric oxide and/or some other suitable dielectric(s). Similarly, in some embodiments, the second ILD layer 112 is a dielectric oxide and/or some other suitable dielectric(s). In some embodiments, the first ILD layer 110 and the second ILD layer 112 are different dielectrics. In some embodiments, the first ILD layer 110 and/or the second ILD layer 112 has/have a lower permeability for moisture and/or vapor than the FEOL layer 108 to prevent moisture and/or vapor from entering the FEOL layer 108 from an ambient environment of the IC chip. Such moisture and/or vapor may corrode and hence damage the semiconductor devices 402. In some embodiments, the second ILD layer 112 has a lower permeability for moisture and/or vapor than the first ILD layer 110 or vice versa.

Figure 12:
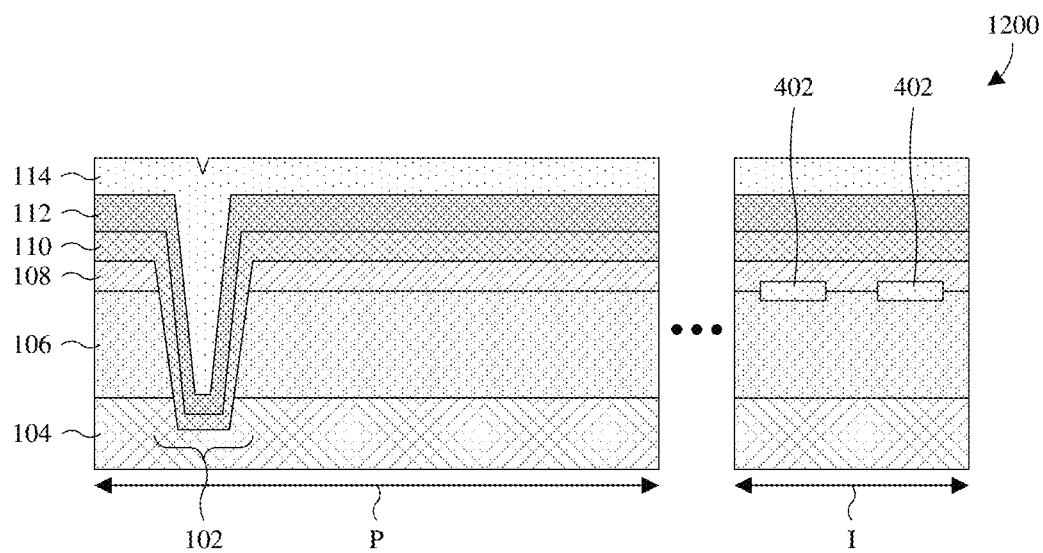

As illustrated by the cross-sectional view 1200 of FIG. 12, a gap fill layer 114 is deposited over the second ILD layer 112 and filling a remainder of the trench 1002 (see, e.g., FIG. 10). The deposition may, for example, be performed by CVD, PVD, some other suitable deposition process(es), or any combination of the foregoing.

In some embodiments, the gap fill layer 114 is or comprise a dielectric oxide and/or some other suitable dielectric(s). In alternative embodiments, the gap fill layer 114 is or comprise a conductive material and/or some other suitable material. In some embodiments, the second ILD layer 112 and the gap fill layer 114 are different materials. In some embodiments, the gap fill layer 114 has a lower permeability for moisture and/or vapor than the FEOL layer 108 to prevent moisture and/or vapor from entering the FEOL layer 108 from an ambient environment of the IC chip. Such moisture and/or vapor may corrode and hence damage the semiconductor devices 402. In some embodiments, the gap fill layer 114 has a lower permeability for moisture and/or vapor than the first and/or second ILD layer(s) 110, 112.

Collectively, the gap fill layer 114 and the first and second ILD layers 110, 112 define a FEOL TSV 102 in the trench 1002. The FEOL TSV 102 may, for example, be referred to a "FEOL" TSV because formation begins at the end of the FEOL processing described with regard to FIG. 9. In some embodiments, the FEOL TSV 102 has a top layout as shown in FIG. 2, but other suitable top layouts are amenable. In some embodiments, the FEOL TSV 102 protects the interior region I. For example, the FEOL TSV 102 may prevent moisture and/or vapor from entering the peripheral region P and diffusing or otherwise moving to the interior region I. As another example, the FEOL TSV 102 may prevents cracks caused by a die saw from propagating to the interior region I from the peripheral region P during separation of the IC chip from a wafer.

As seen hereafter, the trench 1002 (see, e.g., FIG. 10) in which the FEOL TSV 102 is formed may have a small aspect ratio (e.g., a small ratio of height H in FIG. 10 to width W in FIG. 10) because of formation of the trench 1002 before depositing the first and second ILD layers 110, 112 and an IMD layer formed hereafter. Because of the low aspect ratio, the first and second ILD layers 110, 112 and/or the gap fill layer 114 may have a low likelihood of deposition with voids. Voids may hinder the FEOL TSV 102 from protecting the interior region I from cracks, moisture, vapor, or any combination of the foregoing. Therefore, the low likelihood of deposition with voids may decrease the likelihood of the FEOL TSV 102 failing to protect the interior region I and may hence increase yields.

Figure 13:
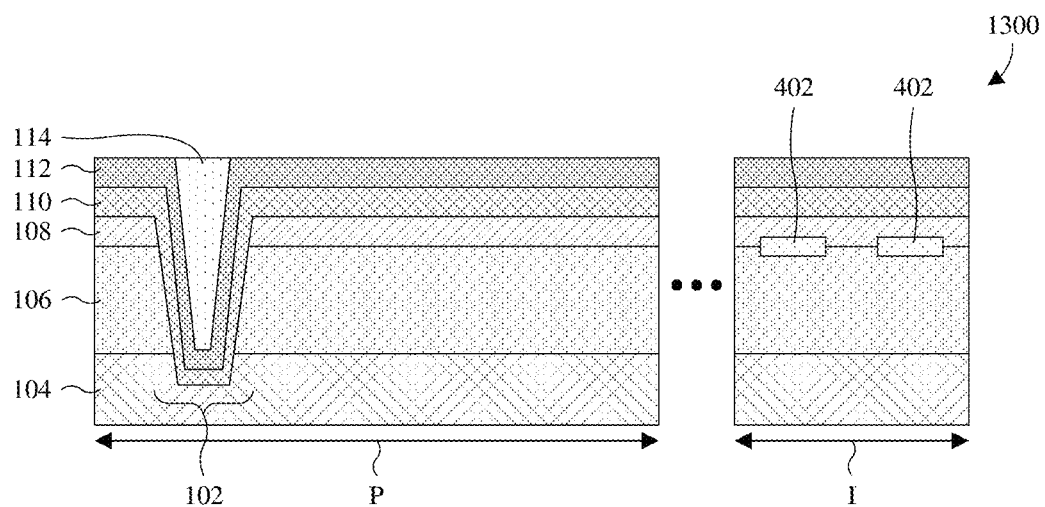

As illustrated by the cross-sectional view 1300 of FIG. 13, a planarization is performed into the gap fill layer 114 to remove the gap fill layer 114 from atop the second ILD layer 112. Further, the planarization flattens a top surface of the gap fill layer 114. In some embodiments, the planarization also co-planarizes the top surface of the gap fill layer 114 with that of the second ILD layer 112 and/or thins the second ILD layer 112. The planarization may, for example, be performed by a chemical mechanical polish (CMP) or some other suitable planarization process.

Figure 14:
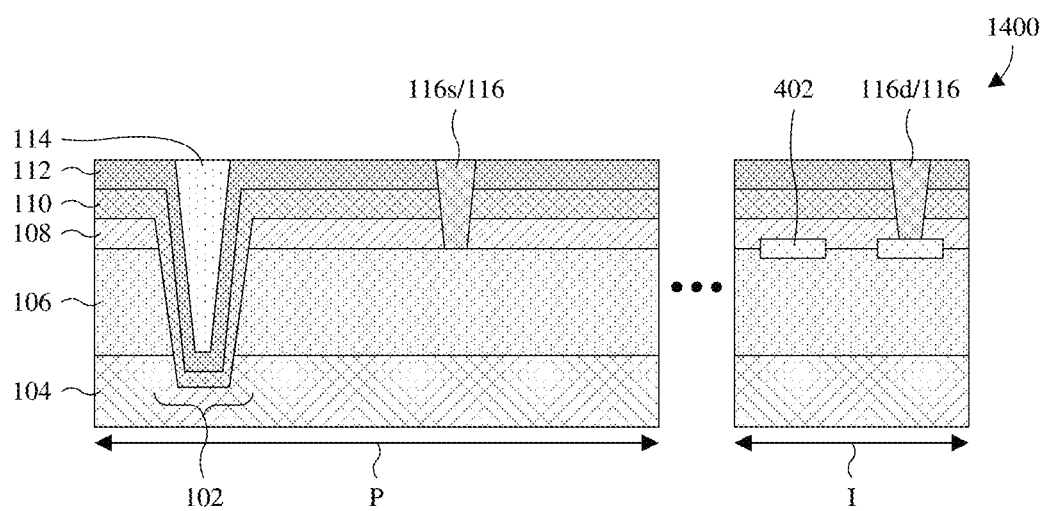

As illustrated by the cross-sectional view 1400 of FIG. 14, contacts 116 are formed in the first and second ILD layers 110, 112 and the FEOL layer 108. A seal contact 116s is formed at the peripheral region P and between the FEOL TSV 102 and the semiconductor devices 402. Further, a device contact 116d is formed at the interior region I on one of the semiconductor devices 402. In alternative embodiments, the seal contact 116s is omitted. The contacts 116 may, for example, be or comprise tungsten and/or some other suitable conductive materials.

Figure 15:
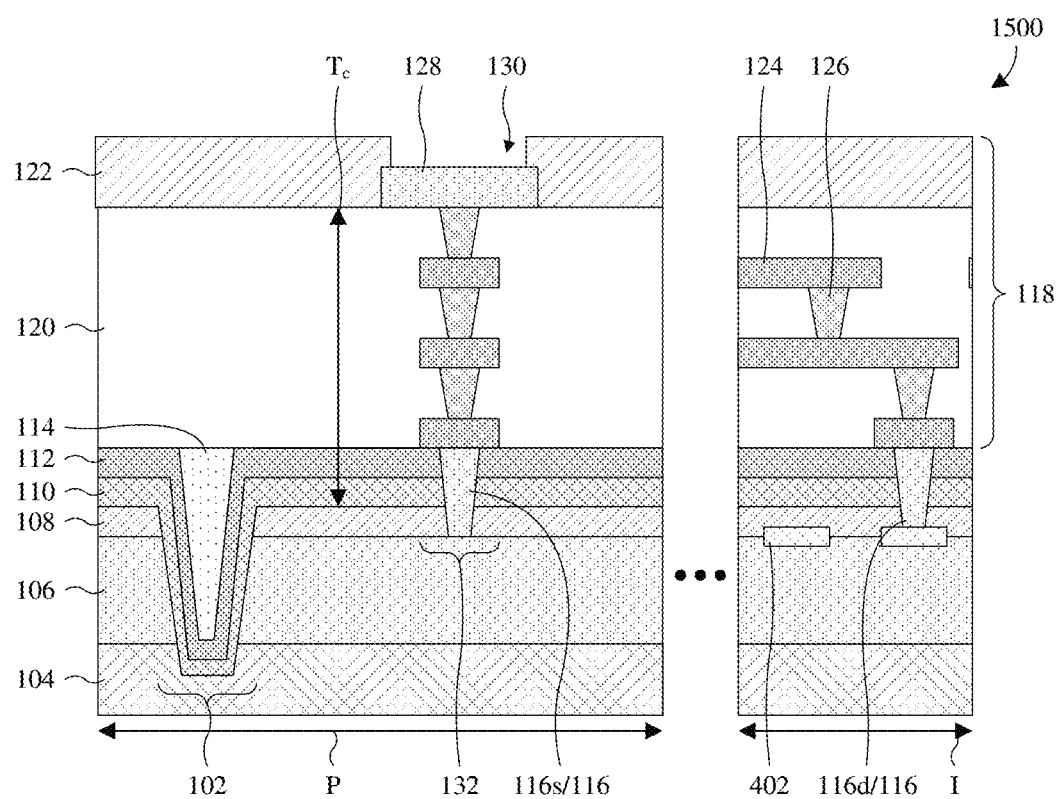

As illustrated by the cross-sectional view 1500 of FIG. 15, BEOL processing is performed to form a BEOL interconnect structure 118 over and electrically coupled to the contacts 116. The BEOL interconnect structure 118 comprises a plurality of wires 124, a plurality of vias 126, and a pad 128 stacked over and electrically coupled to the contacts 116. In some embodiments, there are additional pads (not shown) at the interior region I and configured the same as the pad 128. Wires and vias at the peripheral region P are stacked with the pad 128 and the seal contact 116s to define a conductive seal structure 132 with the seal contact 116s. In some embodiments, the conductive seal structure 132 has a top layout as shown in FIG. 2, but other suitable top layouts are amenable. Further, wires and vias at the interior region I are stacked with the device contact 116d to define conductive paths interconnecting the semiconductor devices 402 and defining a circuit.

The plurality of wires 124 and the plurality of vias 126 are stacked in an IMD layer 120 overlying the second ILD layer 112. Further, the pad 128 is in a passivation layer 122, between the IMD layer 120 and the passivation layer 122. The passivation layer 122 overlies the IMD layer 120 and defines a pad opening 130 exposing the pad 128. In alternative embodiments, the pad 128 and/or the pad opening 130 is/are omitted. The IMD layer 120 is made up of multiple layers (not individually shown) deposited as the wires 124 and the vias 126 are formed, and the passivation layer 122 is deposited after the wires 124 and the vias 126 are formed. In some embodiments, the IMD layer 120 is a dielectric oxide and/or some other suitable dielectric(s). In some embodiments, the second ILD layer 112 and the IMD layer 120 are different dielectrics. The first and second ILD layers 110, 112 and the IMD layer 120 have a combined thickness $T_c$ that is large. In some embodiments, the large thickness $T_c$ is about 120-140 kA, about 120-130 kA, about 130-140 kA, about 125 kA, about 126 kA, or some other suitable value.

As seen through comparison of FIG. 10 to FIG. 15, the etching to form the trench 1002 (see, e.g., FIG. 10) is performed through the FEOL layer 108 and the semiconductor layer 106 before the first and second ILD layers 110, 112 (see, e.g., FIG. 15) and the IMD layer 120 (see, e.g., FIG. 15) are deposited. As such, the etching does not extend through the first and second ILD layers 110, 112 and the IMD layer 120. Further, because the first and second ILD layers 110, 112 and the IMD layer 120 have a combined thickness $T_c$ that is large, the etching would have a large etch depth if it extended through the first and second ILD layers 110, 112 and the IMD layer 120. However, because the etching does not extend through first and second ILD layers 110, 112 and the IMD layer 120, the etching has a small etch depth.

Because the etching has the small etch depth, the etching takes a small amount of time and bulk manufacturing throughput is high. For example, the etching may be about 50% faster or some other suitable percentage faster when not etching through the first and second ILD layers 110, 112 and the IMD layer 120. Further, because the etching has the small etch depth, the etching may be performed with a single photoresist mask (e.g., 1004 at FIG. 10) formed by photolithography. Because photolithography is expensive, using a single photoresist mask may lead to low costs. Further yet, because the etching has the small etch depth, the trench 1002 may have a small aspect ratio (e.g., a small ratio of height H in FIG. 10 to width W in FIG. 10). As such, the FEOL TSV 102 may form with a low likelihood of voids. This may decrease the likelihood of the FEOL TSV 102 failing to protect the interior region I and may hence increase yields.

As seen through review of FIGS. 9-15, forming the FEOL TSV 102 at the end of FEOL processing, instead of at the end of BEOL processing, does not change the film scheme at the interior region I. In other words, the film scheme at the interior region I is the same regardless of whether the FEOL TSV 102 is formed or a BEOL TSV is formed. The film scheme may, for example, correspond to the layout for the first and second ILD layers 110, 112 and the IMD layer 120. Because the film scheme at the interior region I is not changed, the FEOL TSV 102 may replace BEOL TSVs at low cost.

While FIGS. 9-15 are described with reference to a method, it will be appreciated that the structures shown in FIGS. 9-15 are not limited to the method but rather may stand alone separate of the method. While FIGS. 9-15 are described as a series of acts, it will be appreciated that the order of the acts may be altered in other embodiments. While FIGS. 9-15 illustrate and describe as a specific set of acts, some acts that are illustrated and/or described may be omitted in other embodiments. Further, acts that are not illustrated and/or described may be included in other embodiments.

Figure 16:
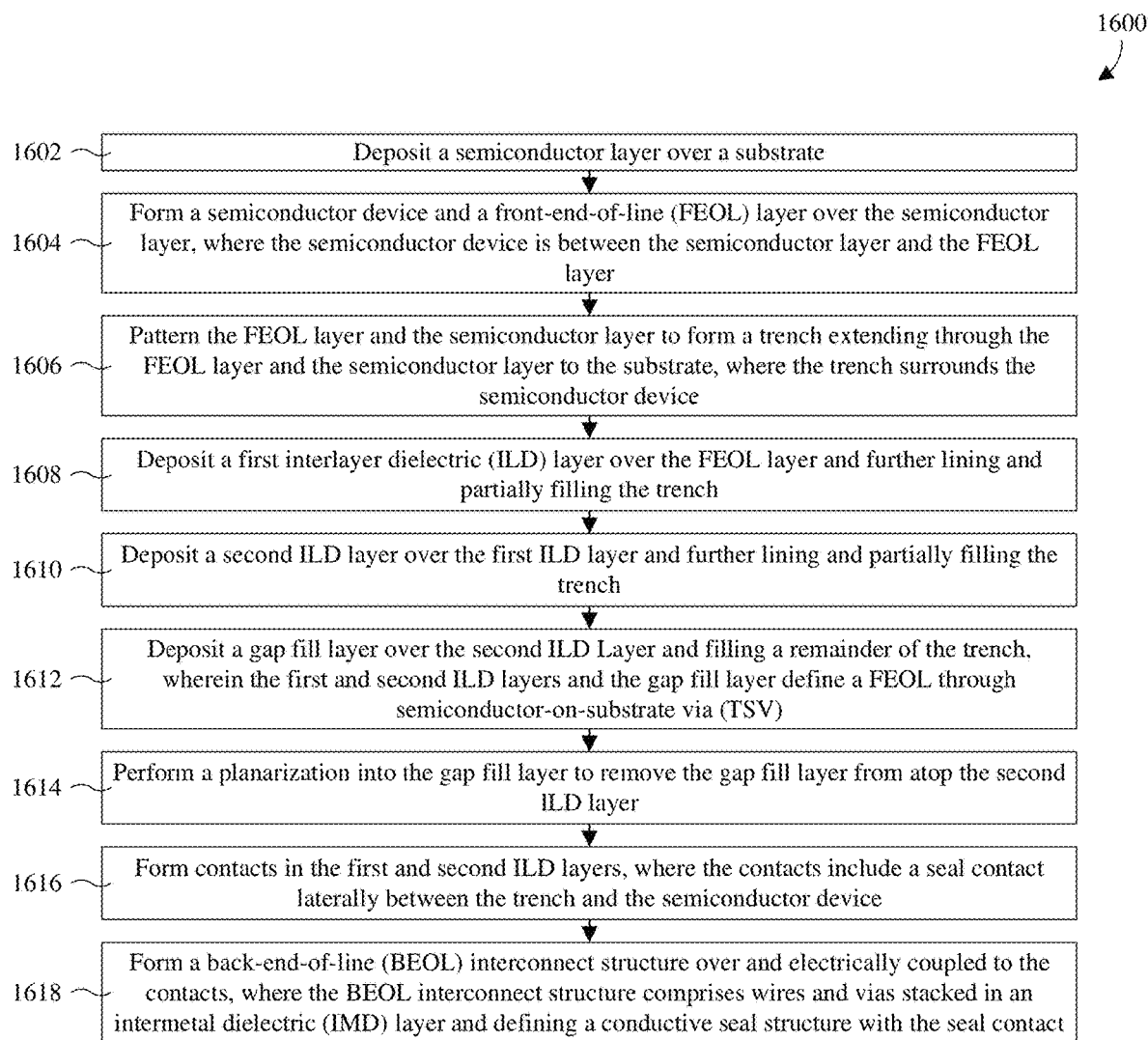
FIG. 16 illustrates a block diagram of some embodiments of the method of FIGS. 9-15.

With reference to FIG. 16, a block diagram 1600 of some embodiments of the method of FIGS. 9-15 is provided.

At 1602, a semiconductor layer is deposited over a substrate. See, for example, FIG. 9.

At 1604, a semiconductor device and a FEOL layer are formed over the semiconductor layer, where the semiconductor device is between the semiconductor layer and the FEOL layer. See, for example, FIG. 9.

At 1606, the FEOL layer and the semiconductor layer are patterned to form a trench extending through the FEOL layer and the semiconductor layer to the substrate, where the trench surrounds the semiconductor device. See, for example, FIG. 10.

At 1608, a first ILD layer is deposited over the FEOL layer and further lining and partially filling the trench. See, for example, FIG. 11.

At 1610, a second ILD layer is deposited over the first ILD layer and further lining and partially filling the trench. See, for example, FIG. 11.

At 1612, a gap fill layer is deposited over the second ILD Layer and filling a remainder of the trench. See, for example, FIG. 12.

At 1614, a planarization is performed into the gap fill layer to remove the gap fill layer from atop the second ILD layer. See, for example, FIG. 13.

At 1616, contacts are formed in the first and second ILD layers, where the contacts include a seal contact laterally between the trench and the semiconductor device. See, for example, FIG. 14.

At 1618, a BEOL interconnect structure is formed over and electrically coupled to the contacts, where the BEOL interconnect structure comprises wires and vias stacked in an IMD layer and defining a conductive seal structure with the seal contact. See, for example, FIG. 15.

While the block diagram 1600 of FIG. 16 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 17:
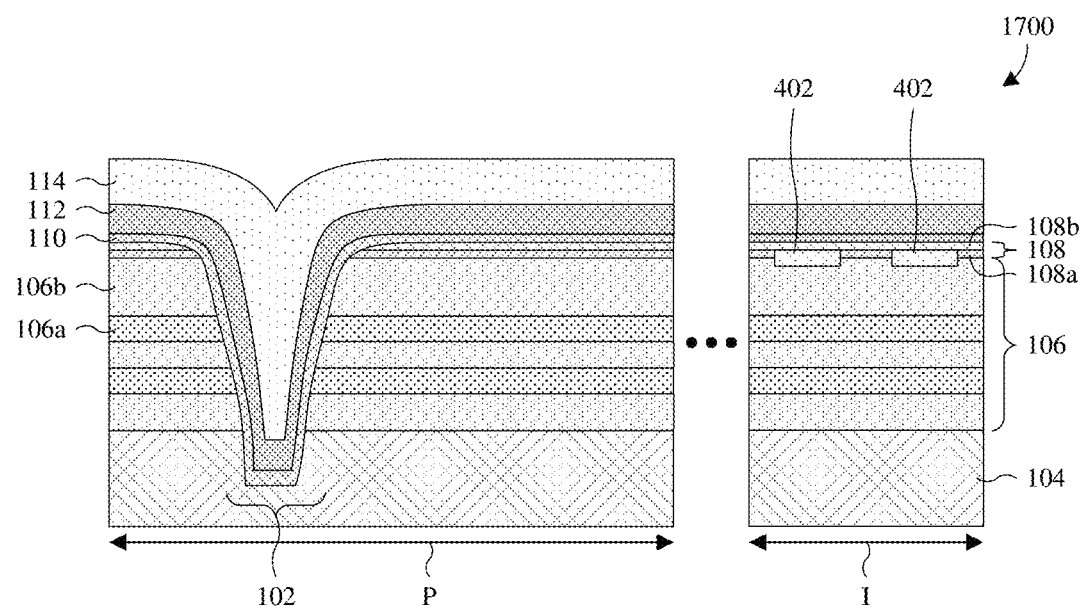
FIGS. 17 and 18 illustrate some alternative embodiments of the IC chip respectively at FIGS. 12 and 13.
Figure 18:
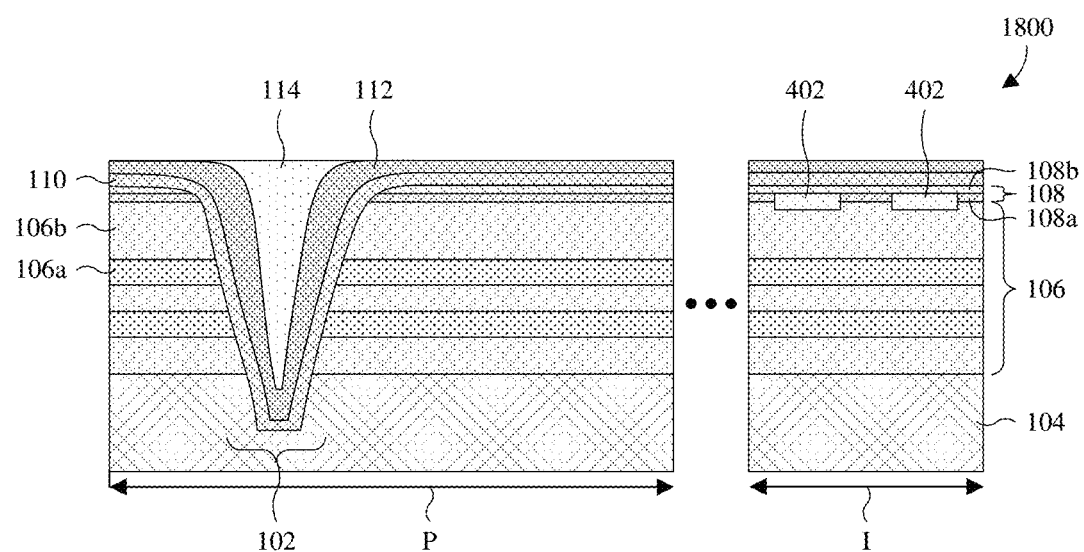

With reference to FIGS. 17 and 18, cross-sectional views 1700, 1800 of some alternative embodiments of the IC chip respectively of FIGS. 12 and 13 are provided. FIG. 17 corresponds to FIG. 12 and hence illustrates some alternative embodiments of the IC chip during deposition of the gap fill layer 114. FIG. 18 corresponds to FIG. 11 and hence illustrates some alternative embodiments of the IC chip during the planarization.

In both FIGS. 17 and 18, the first and second ILD layers 110, 112 and the gap fill layer 114 have dimensions with less uniformity and further have edges and sidewalls that are curved. Further, the semiconductor layer 106 includes multiple layers (e.g., 106a and 106b) and the FEOL layer 108 includes multiple layers (e.g., 108a and 108b). For example, a first layer 106a of the semiconductor layer 106 may be or comprise gallium nitride, whereas a second layer 106b of the semiconductor layer 106 may be or comprise aluminum gallium nitride, or vice versa. Other suitable materials beyond those in the example are, however, amenable.

With reference to FIGS. 19-25, a series of cross-sectional views 1900-2500 of some embodiments of a method for forming an IC chip comprising a FEOL TSV is provided in which the FEOL TSV provides electrical coupling to a substrate. The method may, for example, be employed to form the IC chip in any one or combination of FIGS. 5, 6, and 8 or to form some other suitable IC chip.

Figure 19:
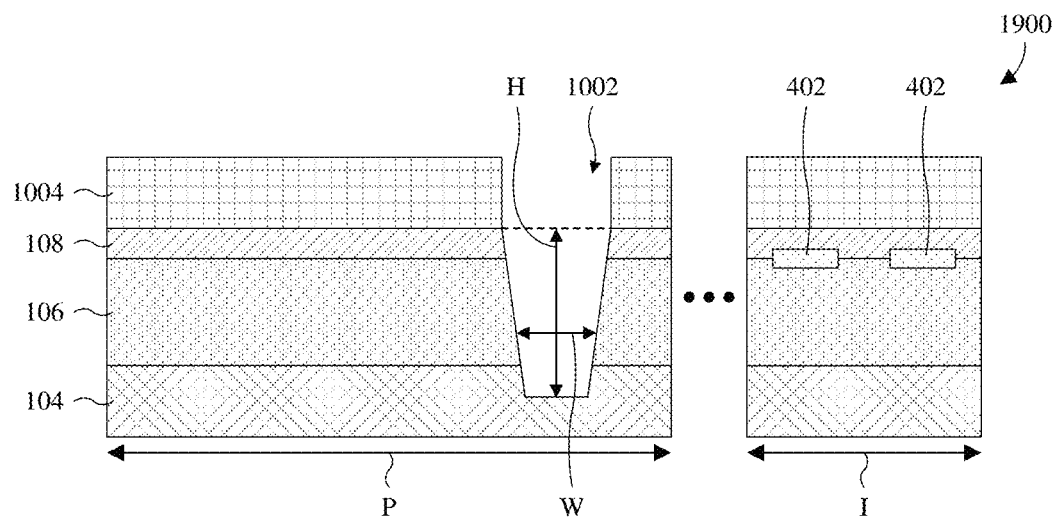
FIGS. 19-26 illustrate a series of cross-sectional views of some embodiments of a method for forming an IC chip comprising a FEOL TSV in which the FEOL TSV provides electrical coupling to a substrate.

As illustrated by the cross-sectional view 1900 of FIG. 19, the acts described with to FIGS. 9 and 10 are performed. A semiconductor layer 106 is deposited over a substrate 104 at a peripheral region P and an interior region I as described with regard to FIG. 9. Further, FEOL processing is performed to form a plurality of semiconductor devices 402 and a FEOL layer 108 as described with regard to FIG. 9. The FEOL layer 108 and the semiconductor layer 106 are then patterned to form a trench 1002 at the peripheral region P as described with regard to FIG. 10. The trench 1002 extends through the FEOL layer 108 and the semiconductor layer 106 to the substrate 104. In some embodiments, the trench 1002 is localized to a single side of the interior region I and/or is line shaped when viewed top down. In alternative embodiments, the trench 1002 is on multiple sides of the interior region I and/or has other suitable shapes when viewed top down. In some embodiments, the trench 1002 has the same top layout as the FEOL TSV 102 in FIG. 6, whereas the interior region I has a top layout as in FIG. 6.

Figure 20:
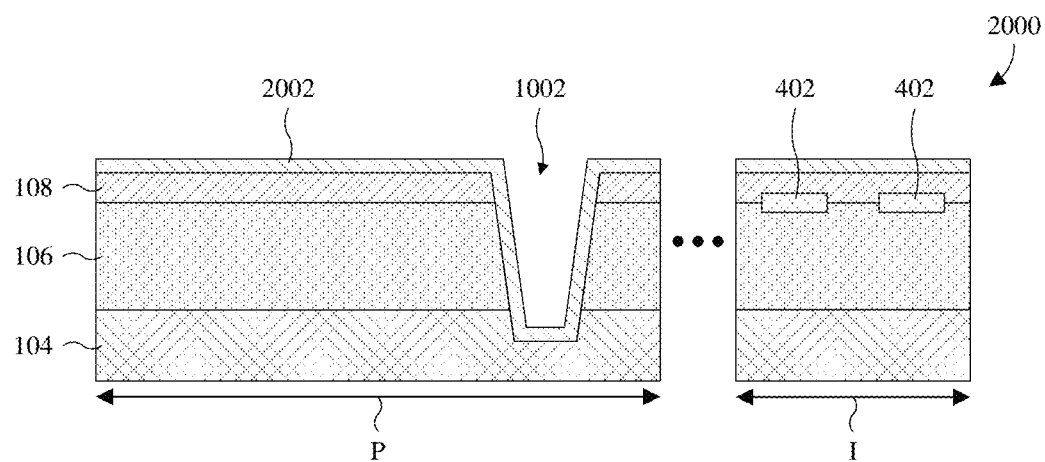

As illustrated by the cross-sectional view 2000 of FIG. 20, a spacer layer 2002 is deposited over the FEOL layer 108 and further lining and partially filling the trench 1002. The spacer layer 2002 may, for example, be or comprise silicon oxide, silicon nitride, silicon oxynitride, some other suitable dielectric(s), or any combination of the foregoing.

Figure 21:
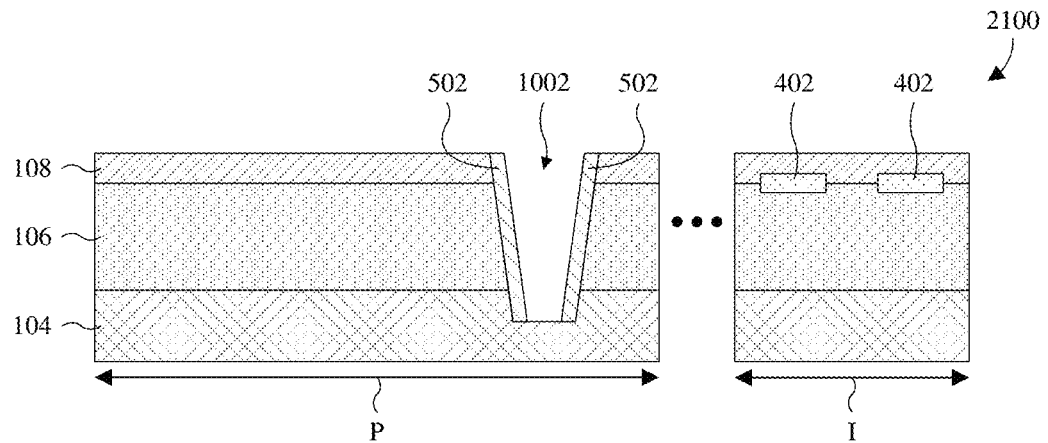

As illustrated by the cross-sectional view 2100 of FIG. 21, the spacer layer 2002 (see, e.g., FIG. 20) is etched back to form a sidewall spacer structure 502 on sidewalls of the trench 1002 (see, e.g., FIG. 20) and to expose the substrate 104 at a bottom of the trench 1002. The etch back removes the spacer layer 2002 from atop the FEOL layer 108 and further removes a horizontal segment of the spacer layer 2002 at the bottom of the trench 1002.

Figure 22:
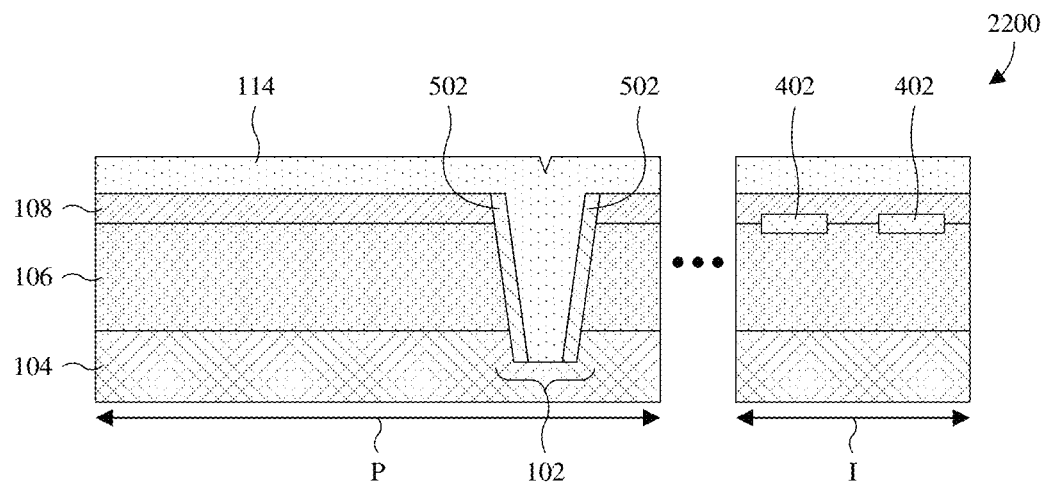

As illustrated by the cross-sectional view 2200 of FIG. 22, a gap fill layer 114 is deposited over the FEOL layer 108 and filling a remainder of the trench 1002 (see, e.g., FIG. 21). The gap fill layer 114 is conductive and electrically couples to the substrate 104. The gap fill layer 114 may, for example, be or comprise metal and/or some other suitable conductive material(s). The deposition may, for example, be performed by CVD, PVD, electroless plating, electroplating, some other suitable deposition process(es), or any combination of the foregoing.

Collectively, the gap fill layer 114 and the sidewall spacer structure 502 define a FEOL TSV 102 in the trench 1002. In some embodiments, the FEOL TSV 102 has a top layout as shown in FIG. 6, but other suitable top layouts are amenable. In some embodiments, as seen hereafter, the FEOL TSV 102 provides electrical coupling between the substrate 104 and a BEOL interconnect structure hereafter formed. The electrical coupling may, for example, be employed to electrically couple the substrate 104 to ground or to a circuit at the interior region I.

Figure 23:
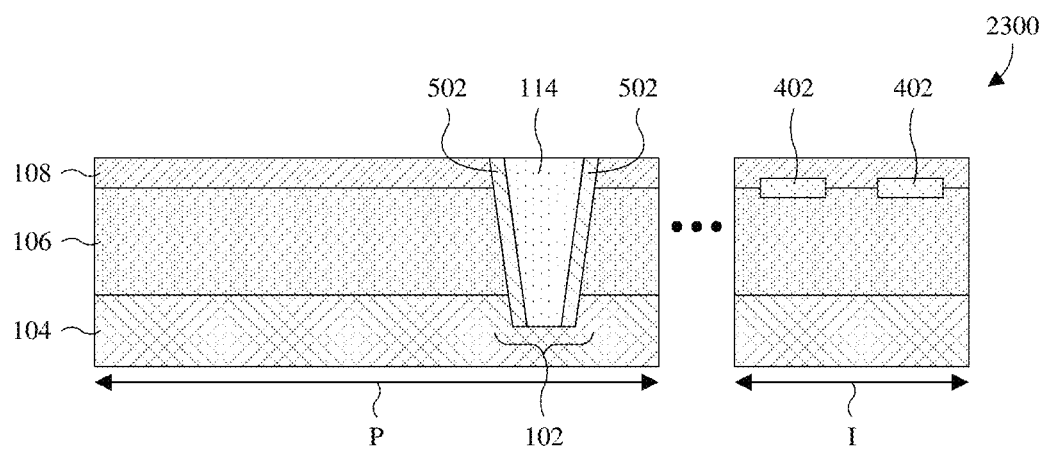

As illustrated by the cross-sectional view 2300 of FIG. 23, a planarization is performed into the gap fill layer 114 to remove the gap fill layer 114 from atop the FEOL layer 108. Further, the planarization flattens a top surface of the gap fill layer 114. In some embodiments, the planarization also co-planarizes the top surface of the gap fill layer 114 with that of the FEOL layer 108 and/or thins the FEOL layer 108. The planarization may, for example, be performed by a CMP or some other suitable planarization process.

Figure 24:
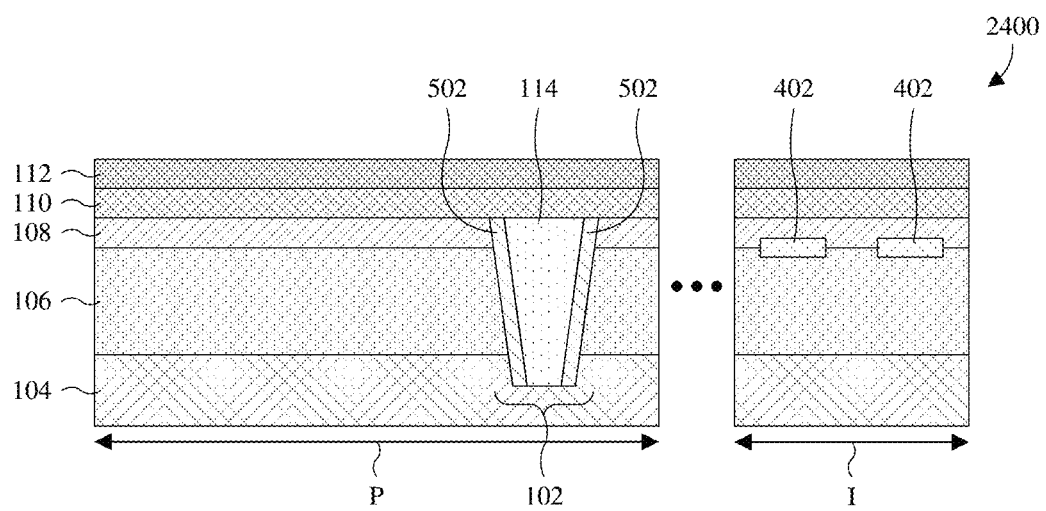

As illustrated by the cross-sectional view 2400 of FIG. 24, a first ILD layer 110 and a second ILD layer 112 are deposited over the FEOL layer 108 as described with regard to FIG. 11. However, in contrast with FIG. 11, the first and second ILD layers 110, 112 are independent of the FEOL TSV 102.

Figure 25:
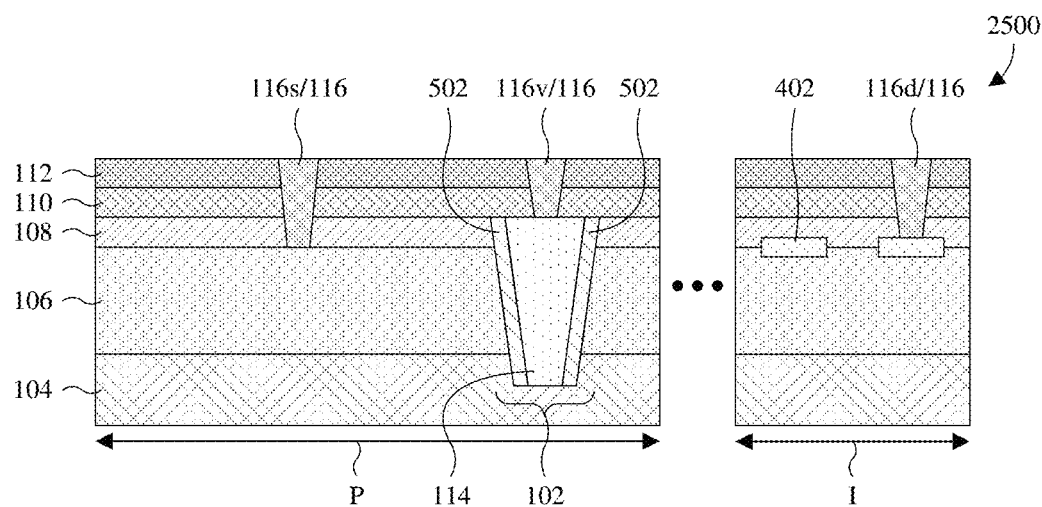
Figure 26:
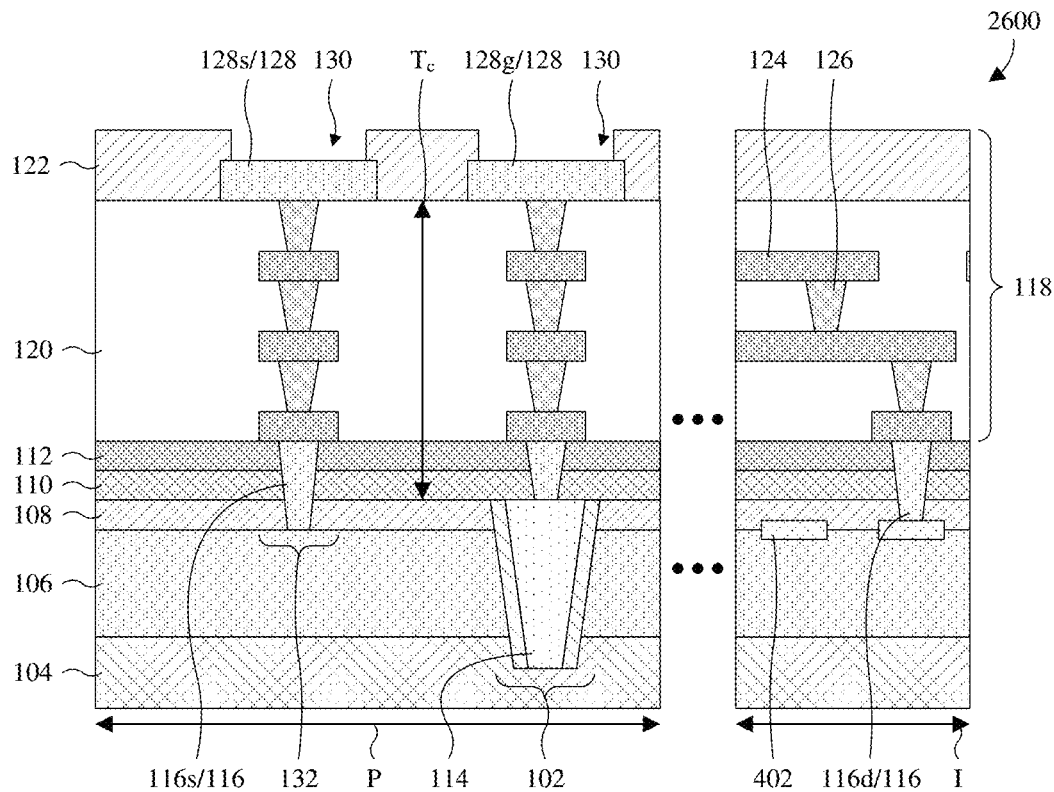

As illustrated by the cross-sectional view 2500 of FIG. 25, contacts 116 are formed in the first and second ILD layers 110, 112 and the FEOL layer 108. A seal contact 116s is formed at the peripheral region P. In alternative embodiments, the seal contact 116s is omitted. A TSV contact 116v is formed overlying the FEOL TSV 102 at the peripheral region P and between the seal contact 116s and the interior region I. A device contact 116d is formed at the interior region I on one of the semiconductor devices 402. The contacts 116 may, for example, be or comprise tungsten and/or some other suitable conductive materials.

As illustrated by the cross-sectional view 2600 of FIG. 2600, BEOL processing is performed to form a BEOL interconnect structure 118 over and electrically coupled to the contacts 116 as described with regard to FIG. 15. The BEOL interconnect structure 118 comprises a plurality of wires 124, a plurality of vias 126, and a plurality of pads 128 stacked over and electrically coupled to the contacts 116. Wires and vias at the peripheral region P are stacked with a seal pad 128s and the seal contact 116s to define a conductive seal structure 132. In some embodiments, the conductive seal structure 132 has a top layout as shown in FIG. 6, but other suitable top layouts are amenable. Additional wires and additional vias at the peripheral region P are stacked with the TSV contact 116v to define a conductive path from the FEOL TSV 102 to a ground pad 128g or some other suitable pad. Wires and vias at the interior region I are stacked with the device contact 116d to define conductive paths interconnecting the semiconductor devices 402 and defining a circuit.

The plurality of wires 124 and the plurality of vias 126 are stacked in an IMD layer 120 overlying the second ILD layer 112. Further, the plurality of pads 128 are in a passivation layer 122, between the IMD layer 120 and the passivation layer 122. The passivation layer 122 overlies the IMD layer 120 and defines pad openings 130 exposing the pads 128. In alternative embodiments, the seal pad 128s and/or a corresponding pad opening is/are omitted. The first and second ILD layers 110, 112 and the IMD layer 120 have a combined thickness $T_c$ that is large. In some embodiments, the large thickness $T_c$ is about 120-140 kÅ, about 120-130 kÅ, about 130-140 kÅ, about 125 kÅ, about 126 kÅ, or some other suitable value.

As seen through comparison of FIG. 19 to FIG. 26, the etching to form the trench 1002 (see, e.g., FIG. 19) is performed through the FEOL layer 108 and the semiconductor layer 106 before the first and second ILD layers 110, 112 (see, e.g., FIG. 26) and the IMD layer 120 (see, e.g., FIG. 26) are deposited. As such, the etching does not extend through the first and second ILD layers 110, 112 and the IMD layer 120. As such, the etching has a small etch depth. Because the etching has the small etch depth, the etching takes a small amount of time and bulk manufacturing throughput is high. Further, the etching may be performed with a single photoresist mask (e.g., 1004 at FIG. 19) formed by photolithography, which reduces costs. Further yet, the trench may have a small aspect ratio (e.g., a small ratio of height H in FIG. 19 to width W in FIG. 19), which reduces the likelihood of voids forming in the FEOL TSV 102. Voids increase a resistance of the FEOL TSV 102 and hence degrade performance of the FEOL TSV 102. Therefore, the low likelihood of the FEOL TSV 102 forming voids may decrease the likelihood of the FEOL TSV 102 falling outside design specifications and may hence increase yields.

As seen through review of FIGS. 19-26, forming the FEOL TSV 102 at the end of FEOL processing, instead of at the end of BEOL processing, does not change the film scheme at the interior region I. In other words, the film scheme at the interior region I is the same regardless of whether the FEOL TSV 102 is formed or a BEOL TSV is formed. As such, the FEOL TSV 102 may replace BEOL TSVs at low cost.

While FIGS. 19-26 are described with reference to a method, it will be appreciated that the structures shown in FIGS. 19-26 are not limited to the method but rather may stand alone separate of the method. While FIGS. 19-26 are described as a series of acts, it will be appreciated that the order of the acts may be altered in other embodiments. While FIGS. 19-26 illustrate and describe as a specific set of acts, some acts that are illustrated and/or described may be omitted in other embodiments. Further, acts that are not illustrated and/or described may be included in other embodiments.

Figure 27:
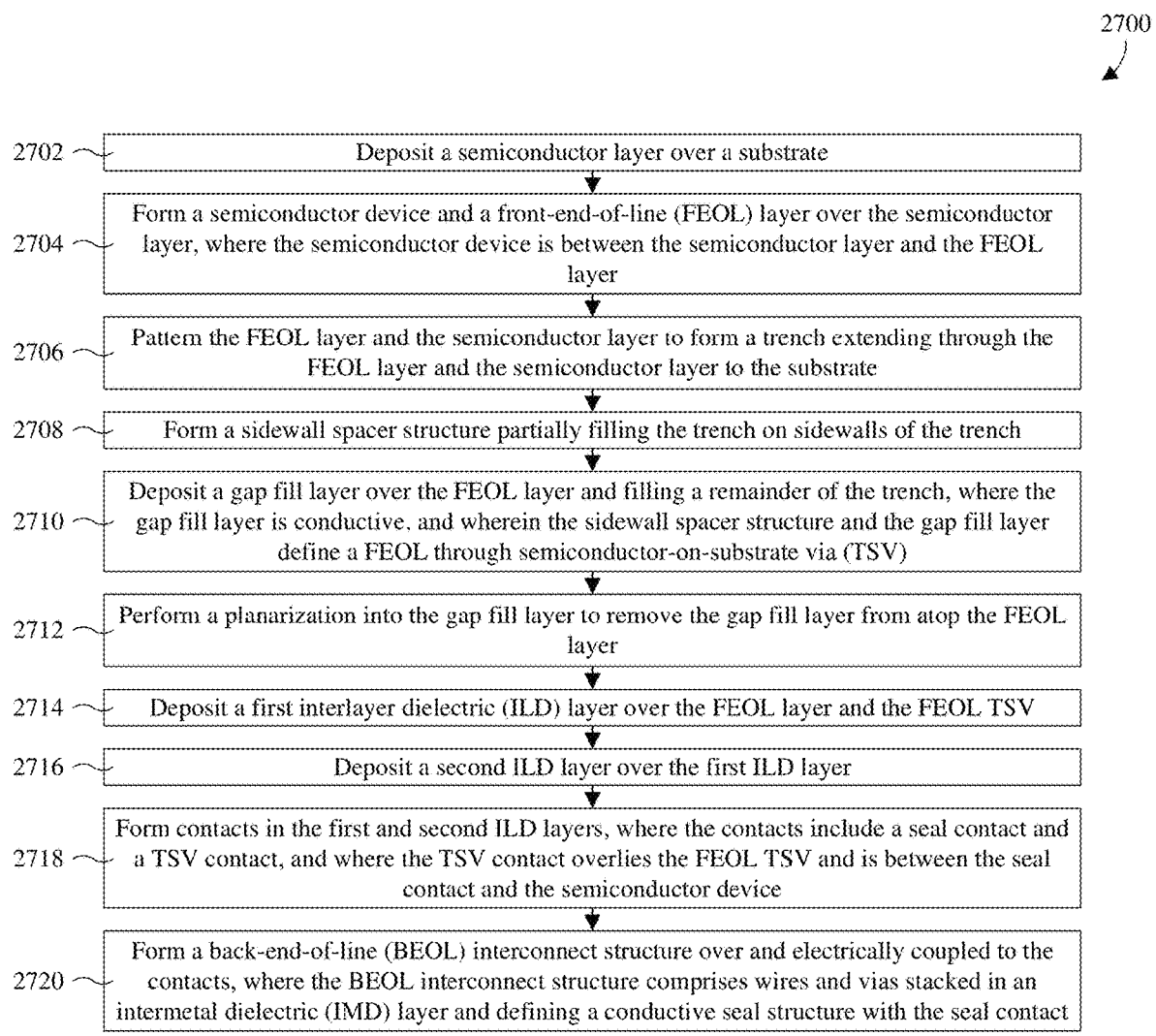
FIG. 27 illustrates a block diagram of some embodiments of the method of FIGS. 19-26.

With reference to FIG. 27, a block diagram 2700 of some embodiments of the method of FIGS. 19-26 is provided.

At 2702, a semiconductor layer is deposited over a substrate. See, for example, FIG. 19.

At 2704, a semiconductor device and a FEOL layer are formed over the semiconductor layer, where the semiconductor device is between the semiconductor layer and the FEOL layer. See, for example, FIG. 19.

At 2706, the FEOL layer and the semiconductor layer are patterned to form a trench extending through the FEOL layer and the semiconductor layer to the substrate. See, for example, FIG. 19.

At 2708, a sidewall spacer structure is formed partially filling the trench on sidewalls of the trench. See, for example, FIGS. 20 and 21.

At 2710, a gap fill layer is deposited over the FEOL layer and filling a remainder of the trench, where the gap fill layer is conductive, and wherein the sidewall spacer structure and the gap fill layer define a FEOL TSV. See, for example, FIG. 22.

At 2712, a planarization is performed into the gap fill layer to remove the gap fill layer from atop the FEOL layer. See, for example, FIG. 23.

At 2714, a first ILD layer is deposited over the FEOL layer and the FEOL TSV. See, for example, FIG. 24.

At 2716, a second ILD layer is deposited over the first ILD layer. See, for example, FIG. 24.

At 2718, contacts are formed in the first and second ILD layers, where the contacts include a seal contact and a TSV contact, and where the TSV contact overlies the FEOL TSV and is between the seal contact and the semiconductor device. See, for example, FIG. 25.

At 2720, a BEOL interconnect structure is formed over and electrically coupled to the contacts, where the BEOL interconnect structure comprises wires and vias stacked in an IMD layer and defining a conductive seal structure with the seal contact. See, for example, FIG. 26.

While the block diagram 2700 of FIG. 27 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides an IC chip including: a substrate; a semiconductor layer overlying the substrate; a FEOL layer overlying the semiconductor layer; a through via extending through the FEOL layer and the semiconductor layer to the substrate at a periphery of the IC chip; and an alternating stack of wires and vias over the through via. In some embodiments, the IC chip further includes an ILD layer overlying the FEOL layer and underlying the alternating stack, wherein the ILD layer has a portion extending through the semiconductor layer to the substrate and partially defining the through via. In some embodiments, the through via is dielectric. In some embodiments, the IC chip further includes a semiconductor device on the semiconductor layer, wherein the through via extends in a closed path along the periphery of the IC chip to surround the semiconductor device. In some embodiments, the alternating stack defines a conductive seal structure that extends in a closed path along the periphery of the IC chip, wherein the through via is between an outermost sidewall of the IC chip and the conductive seal structure. In some embodiments, the IC Chip further includes an ILD layer overlying the FEOL layer and the through via and further underlying the alternating stack, wherein the ILD layer is independent of the through via. In some embodiments, the through via is conductive. In some embodiments, a top layout of the through via is line shaped and is localized to a single side of the IC chip at the periphery of the IC chip. In some embodiments, the IC chip further includes: a pad over the alternating stack; and a contact overlying the through via; wherein the alternating stack and the contact define a conductive path from the through via to the pad.

In some embodiments, the present disclosure provides another IC chip including: a substrate; a semiconductor layer overlying the substrate; a semiconductor device on the semiconductor layer; an interconnect structure overlying the semiconductor device; a contact extending from the interconnect structure to the semiconductor device; and a through via extending through the semiconductor layer to the substrate and having a top surface about even with, or recessed relative to, a top surface of the contact. In some embodiments, the interconnect structure includes a plurality of wires and a plurality of vias defining a conductive seal structure, wherein the conductive seal structure extends in a closed path around the semiconductor device and the through via at a periphery of the IC chip. In some embodiments, the IC chip further includes: a first oxide layer overlying the semiconductor device; and a second oxide layer overlying the first oxide layer and underlying the interconnect structure, wherein the first and second oxide layers are different oxides, and wherein the contact and the through via extend through the first and second oxide layers. In some embodiments, the through via includes a conductive gap fill layer, wherein the IC chip further includes a second contact overlying and directly contacting the conductive gap fill layer. In some embodiments, the semiconductor layer includes a group III-V material, wherein the substrate includes silicon.

In some embodiments, the present disclosure provides a method for forming an IC chip, the method including: depositing a semiconductor layer over a substrate; forming a semiconductor device on the semiconductor layer; forming a FEOL layer over the semiconductor device; patterning the FEOL layer and the semiconductor layer to form a trench extending through the FEOL layer and the semiconductor layer to the substrate at a periphery of the IC chip; filling the trench with dielectric and/or conductive material(s) to form a through via; and forming an IMD layer over the through via and the FEOL layer while simultaneously forming an alternating stack of wires and vias in the IMD layer. In some embodiments, the method further includes forming conductive contacts in the FEOL layer between the filling and the forming of the IMD layer. In some embodiments, the patterning is performed by a single photolithography/etching process. In some embodiments, the filling includes: depositing an ILD layer overlying the FEOL layer and further lining and partially filling the trench; depositing a gap fill layer overlying the ILD layer and further filling a remainder of the trench over the ILD layer; and performing a planarization into the gap fill layer to remove the gap fill layer from atop the ILD layer. In some embodiments, the filling includes: forming a sidewall spacer structure partially filling the trench on sidewalls of the trench; depositing a gap fill layer overlying the FEOL layer and further filling a remainder of the trench, wherein the gap fill layer is conductive; and performing a planarization into the gap fill layer to remove the gap fill layer from atop the FEOL layer. In some embodiments, the method further includes: depositing a first ILD layer covering the through via; and depositing a second ILD layer including a different material than the first ILD layer and covering the first ILD layer, wherein the IMD layer is deposited over the second ILD layer, and wherein the wires and the vias are confined to the IMD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated circuit (IC) chip, the method comprising:
    depositing a semiconductor layer over a substrate;
    forming a semiconductor device on the semiconductor layer;
    forming a front-end-of-line (FEOL) layer completely covering the semiconductor device;
    patterning the FEOL layer and the semiconductor layer to form a trench extending through the FEOL layer and the semiconductor layer to the substrate at a periphery of the IC chip;
    filling the trench with dielectric and/or conductive material(s) to form a through via;
    depositing a first interlayer dielectric (ILD) layer covering the semiconductor device and the FEOL layer;
    forming a conductive contact via extending through the first ILD layer and the FEOL layer to the semiconductor device, wherein the conductive contact via decreases in width continuously from top to bottom; and
    forming an intermetal dielectric (IMD) layer over the through via, the first ILD layer, and the FEOL layer with an alternating stack of wires and vias in the IMD layer.

2. The method according to claim 1, further comprising:
    forming a plurality of conductive contact vias, including the conductive contact via, in the FEOL layer between the filling and the forming of the IMD layer.

3. The method according to claim 1, wherein the patterning is performed by a single photolithography/etching process.

4. The method according to claim 1, wherein the first ILD layer is further deposited lining and partially filling the trench, and wherein the filling comprises:
    depositing a gap fill layer overlying the first ILD layer and further filling a remainder of the trench over the first ILD layer; and
    performing a planarization into the gap fill layer to remove the gap fill layer from atop the first ILD layer.

5. The method according to claim 1, wherein the filling comprises:
    forming a sidewall spacer structure partially filling the trench on sidewalls of the trench;
    depositing a gap fill layer overlying the FEOL layer and further filling a remainder of the trench, wherein the gap fill layer is conductive; and
    performing a planarization into the gap fill layer to remove the gap fill layer from atop the FEOL layer.

6. The method according to claim 5, wherein the first ILD layer is further deposited covering the through via, and wherein the method further comprises:
    depositing a second ILD layer comprising a different material than the first ILD layer and covering the first ILD layer, wherein the IMD layer is deposited over the second ILD layer, and wherein the wires and the vias are confined to the IMD layer.

7. The method according to claim 1, wherein the substrate comprises silicon, and wherein the semiconductor layer comprises a group III-V semiconductor.

8. The method according to claim 1, wherein the through via has a topmost surface level with a topmost surface of the conductive contact via.

9. A method for forming an integrated circuit (IC) chip, the method comprising:
    depositing a semiconductor layer over a substrate;
    forming a semiconductor device on the semiconductor layer;
    performing an etch into the semiconductor layer to form a trench extending through the semiconductor layer to the substrate at a periphery of the IC chip;
    depositing an interlayer dielectric (ILD) layer covering the semiconductor device and further lining and partially filling the trench; and
    forming a plurality of wires and a plurality of vias that are alternatingly stacked over the ILD layer and the semiconductor device.

10. The method according to claim 9, further comprising:
    forming a conductive via extending through the ILD layer to the semiconductor device, wherein the conductive via has a top surface level with a top surface of the ILD layer.

11. The method according to claim 10, wherein the conductive via decreases in width continuously from top to bottom.

12. The method according to claim 10, wherein the forming of the conductive via further comprises:
    performing a second etch into the ILD layer to form an opening exposing the semiconductor device;
    depositing a conductive layer filling the opening; and
    performing a planarization into the conductive layer until a top surface of the ILD layer is reached.

13. The method according to claim 9, further comprising:
    forming a front-end-of-line (FEOL) layer over the semiconductor device;
    wherein the etch is performed into both the semiconductor layer and the FEOL layer to form the trench extending through both the semiconductor layer and the FEOL layer, and wherein a top surface of the FEOL layer has a common elevation at the trench and at a location directly over the semiconductor device at completion of the etch.

14. The method according to claim 9, further comprising:
    depositing a gap fill layer overlying the ILD layer and further filling a remainder of the trench over the ILD layer; and
    performing a planarization into the gap fill layer to remove the gap fill layer from outside the trench, wherein ILD layer persists at covering the semiconductor device upon completion of the planarization.

15. The method according to claim 9, further comprising:
    forming a conductive seal structure extending vertically from the semiconductor layer to a top of the IC chip, and further extending laterally in a closed path around the semiconductor device, to separate the through via from the semiconductor device, wherein the conductive seal structure comprises a conductive via extending from the semiconductor layer and having a top surface level with a top surface of the ILD layer.

16. A method for forming an integrated circuit (IC) chip, the method comprising:
    depositing a semiconductor layer over a substrate;

forming a semiconductor device on the semiconductor layer;

forming a front-end-of-line (FEOL) layer over the semiconductor device;

patterning the FEOL layer and the semiconductor layer to form a trench extending through the FEOL layer and the semiconductor layer to the substrate;

forming a through via filling the trench, wherein a topmost surface of the through via is elevated relative to a topmost surface of the semiconductor device, and wherein the forming of the through via comprises:

depositing a spacer layer covering the FEOL layer and the semiconductor device, and further lining the trench; and etching back the spacer layer to form a sidewall spacer on a sidewall of the semiconductor layer in the trench and to expose the substrate through the trench; and forming an alternating stack of wires and vias over the through via.

17. The method according to claim 16, wherein the FEOL layer has a planar top surface elevated relative to the topmost surface of the semiconductor device and extending from directly over the semiconductor device to a periphery of the IC chip.

18. The method according to claim 16, wherein the semiconductor layer comprises a group III-V semiconductor material.

19. The method according to claim 16, further comprising:

forming a conductive via extending through the FEOL layer to the topmost surface of the semiconductor device, wherein the topmost surface of the through via is level with or recessed relative to a topmost surface of the conductive via, and wherein the conductive via decreases in width continuously from top to bottom.

20. The method according to claim 16, further comprising:

depositing an interlayer dielectric (ILD) layer covering the through via and the semiconductor device; and forming a conductive via extending through the FEOL layer and the ILD layer to the topmost surface of the semiconductor device;

wherein the alternating stack comprises a conductive wire overlying and directly contacting the ILD layer and the conductive via, and wherein the conductive wire has a greatest dimension extending laterally.

* * * * *